United States Patent
Kirsch et al.

(10) Patent No.: US 12,336,362 B2
(45) Date of Patent: *Jun. 17, 2025

(54) DIAMONDOID COMPOUNDS

(71) Applicant: MERCK PATENT GMBH, Darmstadt (DE)

(72) Inventors: Peer Kirsch, Seeheim-Jugenheim (DE); Sebastian Resch, Mainz (DE); Henning Seim, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 689 days.

This patent is subject to a terminal disclaimer.

(21) Appl. No.: 17/609,441

(22) PCT Filed: May 6, 2020

(86) PCT No.: PCT/EP2020/062491
§ 371 (c)(1),
(2) Date: Nov. 8, 2021

(87) PCT Pub. No.: WO2020/225270
PCT Pub. Date: Nov. 12, 2020

(65) Prior Publication Data
US 2022/0209150 A1  Jun. 30, 2022

(30) Foreign Application Priority Data
May 9, 2019 (EP) .................... 19173414

(51) Int. Cl.
| | | |
|---|---|---|
| *H10K 10/50* | (2023.01) | |
| *C07F 9/38* | (2006.01) | |
| *H10K 85/60* | (2023.01) | |
| *H10K 71/00* | (2023.01) | |

(52) U.S. Cl.
CPC ........... *H10K 10/50* (2023.02); *C07F 9/3808* (2013.01); *H10K 85/624* (2023.02); *H10K 85/6574* (2023.02); *H10K 85/6576* (2023.02); *H10K 71/00* (2023.02)

(58) Field of Classification Search
CPC ...... C07F 9/3808; H10K 10/50; H10K 71/00; H10K 85/615; H10K 85/624; H10K 85/654; H10K 85/6572; H10K 85/6574; H10K 85/6576
See application file for complete search history.

(56) References Cited

U.S. PATENT DOCUMENTS

| | | | |
|---|---|---|---|
| 6,187,393 B1 * | 2/2001 | Duffy .................. | C07D 319/06 544/335 |
| 8,022,151 B2 | 9/2011 | Okada et al. | |
| 9,018,199 B2 | 4/2015 | Dyson et al. | |
| 9,172,053 B2 | 10/2015 | Hayashi et al. | |
| 11,063,227 B2 | 7/2021 | Kirsch et al. | |
| 12,046,269 B2 * | 7/2024 | Kirsch ................ | G11C 11/5607 |
| 2005/0099209 A1 | 5/2005 | Luyken et al. | |
| 2011/0112061 A1 | 5/2011 | Hu et al. | |
| 2013/0155338 A1 | 6/2013 | Junge | |
| 2014/0008601 A1 | 1/2014 | Nishizawa et al. | |
| 2018/0006253 A1 | 1/2018 | Kirsch et al. | |
| 2022/0238816 A1 | 7/2022 | Kirsch et al. | |

FOREIGN PATENT DOCUMENTS

| | | |
|---|---|---|
| JP | 2004315461 A | 11/2004 |
| JP | 2011514365 A | 5/2011 |
| JP | 2013541600 A | 11/2013 |
| JP | 2022532553 A | 7/2022 |
| TW | 200909423 A | 3/2009 |
| WO | 2007128158 A1 | 11/2007 |
| WO | 12127542 A1 | 9/2012 |
| WO | 16110301 A1 | 7/2016 |
| WO | 18007337 A2 | 1/2018 |
| WO | 20039088 A2 | 2/2020 |
| WO | 2020225398 A1 | 11/2020 |

OTHER PUBLICATIONS

STN Aug. 27, 2004 one page (Year: 2004).*
STN Mar. 17, 2013 one page (Year: 2013).*
U.S. Appl. No. 17/609,456 (Year: 2022).*
U.S. Appl. No. 17/770,311 (Year: 2023).*
Office Action in corresponding TW application No. 109115039 dated Nov. 8, 2023 (pp. 1-3) and English translation thereof (pp. 1-6).
Office Action in corresponding JP application No. 2021-566139 dispatched May 22, 2024 (pp. 1-2).
Registry(STN)[online], (Search date May 11, 2024) (1) RN:2129621-96-9(Sep. 22, 2017) (2) RN: 1955888-54-6(Jul. 20, 2016) (3) RN:1949002-77-0(Jul. 10, 2016) (4) RN:1920666-09-6(May 30, 2016) (5) RN:1907419-62-8(May 10, 2016) (6) RN:1901533-14-9(May 2, 2016) (7) RN:1901507-97-8(May 2, 2016) (8) RN:1900501-43-0(Apr. 29, 2016) (9) RN:1796700-05-4(Jul. 8, 2015) (10)RN:1796417-32-7(Jul. 7, 2015).
Shiryaev VA, Radchenko EV, Palyulin VA, Zefirov NS, Bormotov NI, Serova OA, Shishkina LN, Baimuratov MR, Bormasheva KM, Gruzd YA, Ivleva EA, Leonova MV, Lukashenko AV, Osipov DV, Osyanin VA, Reznikov AN, Shadrikova VA, Sibiryakova AE, Tkachenko IM, Klimochkin YN. Molecular design, synthesis and biological evaluation of cage compound-based inhibitors of hepatitis C virus p7 ion channels. Eur J Med Chem. Oct. 5, 2018;158:214-235. doi: 10.1016/j.ejmech.2018.08.009. Epub Aug. 6, 2018. PMID: 30218908.

(Continued)

*Primary Examiner* — Yevgeny Valenrod
*Assistant Examiner* — Blaine G Doletski
(74) *Attorney, Agent, or Firm* — Csaba Henter; MILLEN, WHITE, ZELANO & BRANIGAN, P.C.

(57) ABSTRACT

The present invention relates to diamondoid compounds of formula I $$D^1\text{-}Z^D\text{-}(A^1\text{-}Z^1)_r\text{-}B^1\text{-}(Z^2\text{-}A^2)_s\text{-}Sp\text{-}G \qquad (I)$$

in which the occurring groups and parameters have the meanings given in claim 1, to the use thereof for the formation of molecular layers, in particular self assembled monolayers (SAM), to a process for the fabrication of a switching element for memristive devices comprising said molecular layers and to a memristic device comprising said switching element.

20 Claims, 2 Drawing Sheets

(56) References Cited

OTHER PUBLICATIONS

Fort et al.,"Adamantane: Consequences of the Diamondoid Structure" Chem. Rev. 1964, 64, 277-300.
Schreiner et al., "Diamondoids: functionalization and subsequent applications of perfectly defined molecular cage hydrocarbons" New J. Chem. 2014, 38, 28-41.
Narasimha et al., "Ultralow effective work function surfaces using diamondoid monolayers" Nature Nanotechnology 2016, 11, 267-273.
A. Ulman, "Formation and Structure of Self-Assembled Monolayers" Chem. Rev. 1996, 96, 1533-1554.
International Search report PCT/EP2020/062491 dated Jan. 9, 2020 (pp. 1-2).

* cited by examiner

DIAMONDOID COMPOUNDS

The present invention relates to diamondoid compounds, to the use thereof for the formation of molecular layers, in particular of self assembled monolayers (SAM), to a process for the fabrication of a switching element for memristive devices comprising said molecular layers and to a memristic device comprising said switching element.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between a high and a low electrical resistance. The respective state (high resistance or low resistance) is retained even without a supply voltage, meaning that non-volatile memories can be achieved with memristors.

WO 2012/127542 A1 and US 2014/008601 A1, for example, disclose organic molecular memories which have two electrodes and an active region which is arranged between the two electrodes. The active region has a molecular layer of electrically conductive aromatic alkynes, whose conductivity can be changed under the influence of an electric field. Similar components based on redox-active bipyridinium compounds are proposed in US 2005/0099209 A1.

The known memories based on a change in conductivity or resistance have the disadvantage that the free-radical intermediates formed by the flow of current through the molecules of the molecular layer are in principle susceptible to degradation processes, which has an adverse effect on the lifetime of the components.

In WO 2018/007337 A2 an improved switching layer is described that makes use of a non-redox active molecular layer comprising dipolar compounds linked to a substrate via an aliphatic spacer group where the compounds are reversibly switched by application of an electric field which causes re-orientation of the molecular dipole and thus enabling a low-resistive state and a high-resistive state depending on the respective orientation of the molecules.

In order to obtain electrically switchable tunnel junctions from organic compounds with a conformationally flexible dipole, a molecular layer enclosed as a sandwich between two conductive electrodes is required. The deposition of this molecular layer onto electrodes is achieved either by spin-coating or by dip-coating from an organic solvent. The basic principle of the resulting memory device is described in WO 2016/110301 A1 and WO 2018/007337 A2. In order to limit the formation of short circuits between top electrode and bottom electrode, the monolayer has to be as tight as possible, without pinholes allowing the permeation of top electrode material during its deposition process. There is also a strong demand for materials which form molecular layers of acceptable quality within very short deposition times.

For the structuring of electrodes photolithography is commonly used. A major problem of the state-of-the-art molecular layers is their hydrophobicity, showing water contact angles (CWA) typically around 104°. Most photoresists require a CWA of the substrates below this value. With increasing CWA dewetting occurs in an uncontrollably fashion during spin coating of a photoresist solution, resulting in uneven deposition. This impedes the structuring of electrode structures on top of the molecular layer. For even spreading and good adhesion of photoresists and lift-off resists, a CWA significantly below 100° is required. At the same time the molecular layer surface should have a dense packing as well as low, alkane-like chemical reactivity.

A problem to be solved by the present invention is to provide improved materials for the fabrication of switchable molecular layers which are compatible with processes commonly used in the semiconductor industry.

To solve the problem a compound of formula I shown below is provided which comprises a terminal diamondoid partial structure connected to a polar ring element that can be self assembled onto a substrate by means of an anchor group attached to the polar ring via a flexible spacer group.

The present invention further relates to a process for the production of a switching element comprising a molecular layer obtainable from one or more compounds of formula I. The present invention further relates to a memristive device comprising said switching element.

Preferred embodiments are subject-matter of the dependent claims and can also be taken from the description.

The present invention relates to a compound of formula I $$D^1\text{-}Z^D\text{-}(A^1\text{-}Z^1)_r\text{-}B^1\text{-}(Z^2\text{-}A^2)_s\text{-}Sp\text{-}G \quad (I)$$

in which $D^1$ denotes a diamondoid radical, preferably derived from a lower diamondoid, very preferably selected from the group consisting of adamantyl, diamantyl, and triamantyl, in which one or more H atoms can be replaced by F, in each case optionally fluorinated alkyl, alkenyl or alkoxy having up to 12 C atoms, in particular

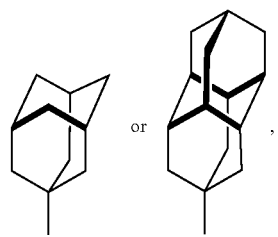

or $A^1$, $A^2$ on each occurrence, identically or differently, denote an aromatic, heteroaromatic, alicyclic or heteroaliphatic ring having 4 to 25 ring atoms, which may also contain condensed rings and which may be mono- or poly-substituted by Y, Y on each occurrence, identically or differently, denotes F, Cl, CN, SCN, $SF_5$ or straight-chain or branched, in each case optionally fluorinated alkyl, alkoxy, alkylcarbonyl, alkoxycarbonyl, alkyl-carbonyloxy or alkoxycarbonyloxy having 1 to 12 C atoms, $B^1$ denotes

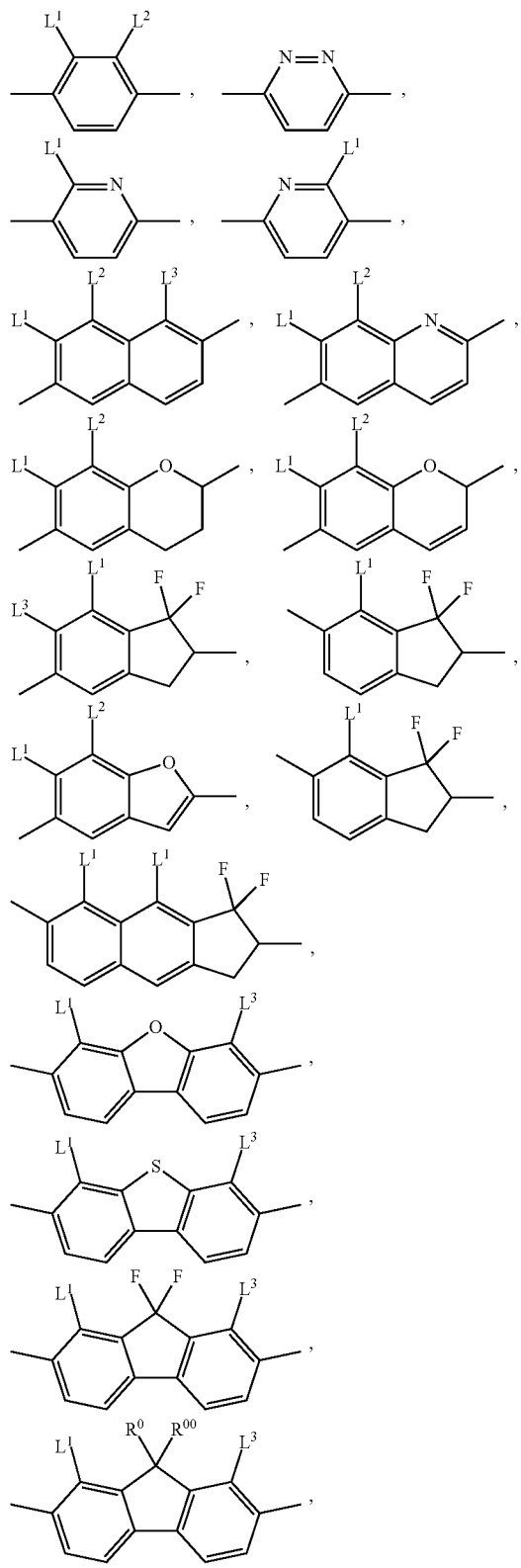

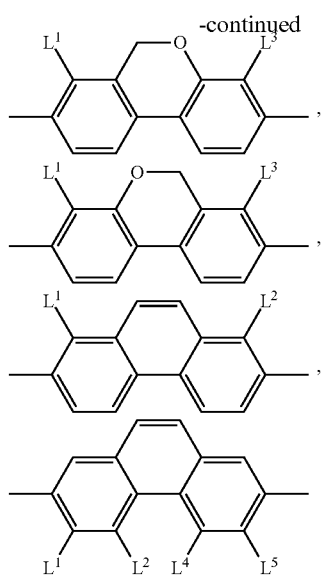

where the groups may be oriented in both directions, $L^1$ to $L^5$, independently of one another, denote F, Cl, Br, I, CN, $SF_5$, $CF_3$ or $OCF_3$, preferably Cl or F, where $L^3$ may alternatively also denote H, $Z^1$, $Z^2$ on each occurrence, identically or differently, denote a single bond, —$CF_2O$—, —$OCF_2$—, —$CF_2S$—, —$SCF_2$—, —$CH_2O$—, —$OCH_2$—, —C(O)O—, —OC(O)—, —C(O)S—, —SC(O)—, —$(CH_2)_{n1}$—, —$(CF_2)_{n2}$—, —$CF_2$—$CH_2$—, —$CH_2$—$CF_2$—, —CH=CH—, —CF=CF—, —CF=CH—, —CH=CF—, —$(CH_2)_{n3}O$—, —$O(CH_2)_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, $Z^D$ has one of the meanings of $Z^1$ and $Z^2$ or of Sp, and preferably has one of the meanings of $Z^1$ and $Z^2$, Sp denotes a spacer group or a single bond, preferably a spacer group G denotes —CH=$CH_2$, —OH, —CH($CH_2OH)_2$, —C($CH_2OH)_3$, —SH, —$SO_2OH$, —OP(O)$(OH)_2$, —PO$(OH)_2$, —C(OH)(PO$(OH)_2)_2$, —COOH, —B$(OH)_2$, —Si$(OR^x)_3$ or —$SiCl_3$, —$SO_2OR^v$, —OP(O)$(OR^v)_2$, —PO$(OR^v)_2$, —C(OH)(PO$(OR^v)_2)_2$, —$COOR^v$ or —Si$(OR^v)_3$, $R^V$ denotes straight chain or branched alkyl having 1 to 20 C atoms, preferably a secondary or tertiary alkyl having up to 20 C atoms, $R^x$ denotes straight-chain or branched alkyl having 1 to 6 C atoms, and r and s, independently of one another, denote 0, 1, 2 or 3, where $r+s≤4$, with the proviso that if Sp denotes a single bond, $Z^2$ is not O, S, $CH_2$ or $CF_2$.

The molecular layers obtained from compounds of formula I are distinguished by dense packing and low CWA and enable the fabrication of switching elements for memristive devices that can be patterned by photolithography using standard industrial processes. Surprisingly, the molecular layers are further distinguished by a high break down bias.

Figure 1:
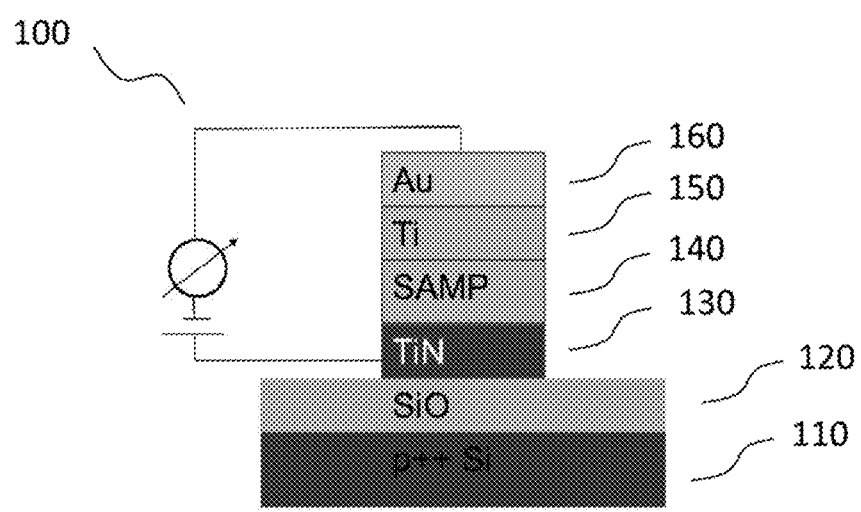
FIG. 1 a schematic illustration of the layer structure of a memristive memory element, FIG. 2 an exemplary logarithmic plot of measured current density values versus applied voltages of an exemplary embodiment of a memory device having a resistive switching memory element.

The term "diamondoids" refers to substituted and unsubstituted cage compounds of the adamantane series including adamantane, diamantane, triamantane, tetramantanes, pentamantanes, hexamantanes, heptamantanes, octamantanes, and the like, including all isomers and stereoisomers thereof. The compounds have a "diamondoid" topology, which means their carbon atom arrangement is superimposable on a fragment of a face centered cubic diamond lattice. Substituted diamondoids from the first of the series are preferable with 1 to 4 independently-selected alkyl or alkoxy substituents.

Diamondoids include "lower diamondoids" and "higher diamondoids," as these terms are defined herein, as well as mixtures of any combination of lower and higher diamondoids. The term "lower diamondoids" refers to adamantane, diamantane and triamantane and any and/or all unsubstituted and substituted derivatives of adamantane, diamantane and triamantane. These lower diamondoid components show no isomers or chirality and are readily synthesized, distinguishing them from "higher diamondoids." The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; as well as mixtures of the above and isomers and stereoisomers of tetramantane, pentamantane, hexamantane, heptamantane, and octamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane, (two of which represent an enantiomeric pair), i.e., four different possible ways or arranging the four adamantane subunits. The number of possible isomers increases non-linearly with each higher member of the diamondoid series, pentamantane, hexamantane, heptamantane, octamantane, etc. Adamantane, which is commercially available, has been studied extensively. The studies have been directed toward a number of areas, such as thermodynamic stability, functionalization, and the properties of adamantane-containing materials. For instance, Schreiber et al., New J. Chem., 2014, 38, 28-41 describes the synthesis and application of functionalized diamondoids to form large area SAMs on silver and gold surfaces. In K. T. Narasimha et al., Nature Nanotechnology 11, Mar. 2016 page 267-273, monolayers of diamondoids are described to effectively confer enhanced field emission properties to metal surfaces due to a significant reduction of the work function of the metal.

As used herein, an anchor group is a functional group by means of which a compound is adsorbed onto or bonded to the surface of the substrate by physisorption, chemisorption or by chemical reaction.

A spacer group in the sense of the present invention is a flexible chain between dipolar moiety and anchor group which causes a separation between these sub-structures and, owing to its flexibility, at the same time improves the mobility of the dipolar moiety after bonding to a substrate.

The spacer group can be branched or straight chain. Chiral spacers are branched and optically active.

Herein, alkyl is straight-chain or branched and has 1 to 15 C atoms, is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

Herein, an alkoxy radical is straight-chain or branched and contains 1 to 15 C atoms. It is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

Herein, an alkenyl radical is preferably an alkenyl radical having 2 to 15 C atoms, which is straight-chain or branched and contains at least one C—C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C—C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred.

Herein alkynyl is taken to mean an alkynyl radical having 2 to 15 C atoms, which is straight-chain or branched and contains at least one C—C triple bond. 1- and 2-propynyl and 1-, 2- and 3-butynyl are preferred.

In formula I, preferred aryl groups are derived, for example, from the parent structures benzene, naphthalene, tetrahydronaphthalene, 9,10-dihydrophenanthrene, fluorene, indene and indane.

In formula I, preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazothiophene, 2H-chromen (2H-1-benzopyran), 4H-chromene (4H-1-benzopyran) and coumarin (2H-chromen-2-one), or combinations of these groups.

In formula I, preferred cycloaliphatic groups are cyclobutane, cyclopentane, cyclohexane, cyclohexene, cycloheptane, decahydronaphthalene, bicyclo-[1.1.1]pentane, bicyclo[2.2.2]octane, spiro[3.3]heptane and octahydro-4,7-methanoindane.

In formula I, preferred heteroaliphatic groups are tetrahydrofuran, dioxolane, tetrahydrothiofuran, pyran, dioxane, dithiane, silinane, piperidine and pyrrolidine.

$A^1$ and $A^2$, on each occurrence, identically or differently are more preferably selected from the following groups:
a) 1,4-phenylene, in which, in addition, one or two CH groups may be replaced by N and in which, in addition, one or more H atoms may be replaced by Y,
b) the group consisting of trans-1,4-cyclohexylene and 1,4-cyclohexenylene, in which, in addition, one or more non-adjacent $CH_2$ groups may be replaced by —O— and/or —S— and in which, in addition, one or more H atoms may be replaced by Y, and
c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which, in addition, one or more H atoms may be replaced by Y, where Y has the meaning indicated above under formula I and preferably denotes F, Cl, CN or $CF_3$.

In formula I, preferred spacer groups Sp are selected from the formula Sp'-X', so that the radical G-Sp- corresponds to the formula G-Sp'-X'- and so that the radical $D^1$-Sp- corresponds to the formula $D^1$-Sp'-X', in which Sp' denotes straight-chain or branched alkylene having 1 to 20, preferably 1 to 12 C atoms, which is optionally mono- or poly-substituted by F, Cl, Br, I or CN and in which, in addition, one or more non-adjacent $CH_2$ groups may each be replaced, independently of one another, by —O—, —S—, —NH—, —$NR^0$—, —$SiR^{00}R^{000}$—, —CO—, —COO—, —OCO—, —OCO—O—, —S—CO—, —CO—S—, —$NR^0$—CO—O—, —O—CO—$NR^0$—, —$NR^0$—CO—$NR^0$—, —CH=CH— or —C≡C— in such a way that O and/or S atoms are not linked directly to one another, X' denotes —O—, —S—, —CO—, —COO—, —OCO—, —O—COO—, —CO—$NR^{00}$—, —$NR^{00}$—CO—, —$NR^{00}$—CO—$NR^{00}$—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^{00}$—, —$CY^x$=$CY^{x'}$—, —C≡C—, —CH=CH—COO—, —OCO—CH=CH— or a single bond, $R^0$, $R^{00}$ and $R^{000}$ each, independently of one another, denote H or alkyl having 1 to 12 C atoms, and $Y^x$ and $Y^{x'}$ each, independently of one another, denote H, F, Cl or CN.

X' is preferably —O—, —S—, —CO—, —COO—, —OCO—, —O—COO—, —CO—$NR^0$—, —$NR^0$—CO—, —$NR^0$—CO—$NR^0$— or a single bond.

Preferred groups Sp' are —$(CH_2)_{p1}$—, —$(CF_2)_{p1}$—, —$(CH_2CH_2O)_{q1}$—$CH_2CH_2$—, —$(CF_2CF_2O)_{q1}$—$CF_2CF_2$—, —$CH_2CH_2$—S—$CH_2CH_2$—, —$CH_2CH_2$—NH—$CH_2CH_2$— or —$(SiR^{00}R^{000}$—O$)_{p1}$—, in which p1 is an integer from 1 to 12, q1 is an integer from 1 to 3, and $R^{00}$ and $R^{000}$ have the meanings indicated above.

Particularly preferred groups -X'-Sp'- are —$(CH_2)_{p1}$—, —O—$(CH_2)_{p1}$—, —$(CF_2)_{p1}$—, —O$(CF_2)_{p1}$—, —OCO—$(CH_2)_{p1}$— and —OC(O)O—$(CH_2)_{p1}$—, in which p1 has the meaning indicated above.

Particularly preferred groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethyleneoxyethylene, methyleneeoxybutylene, ethylenethioethylene, ethylene-N-methyliminoethylene, 1-methylalkylene, ethenylene, propenylene and butenylene.

Particularly preferred groups X' are —O— or a single bond.

Particularly preferred sub-formulae of the formula I are the sub-formulae Ia to If:

$D^1$-$Z^D$-$B^1$-Sp-G  Ia $D^1$-$Z^D$-($A^1$-$Z^1$)-$B^1$-Sp-G  Ib $D^1$-$Z^D$-($A^1$-$Z^1$)$_2$-$B^1$-Sp-G  Ic $D^1$-$Z^D$-$B^1$-($Z^2$-$A^2$)-Sp-G  Id $D^1$-$Z^D$-$B^1$-($Z^2$-$A^2$)$_2$-Sp-G  Ie $D^1$-$Z^D$-($A^1$-$Z^1$)-$B^1$-($Z^2$-$A^2$)-Sp-G  If in which $D^1$, $A^1$, $A^2$, $B^1$, $Z^D$, $Z^1$, $Z^2$, Sp and G have the meanings indicated above.

In formula I and its subformulae, very preferably $A^1$ and identically or differently, denote

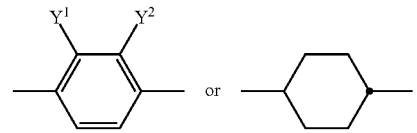

$B^1$ denotes

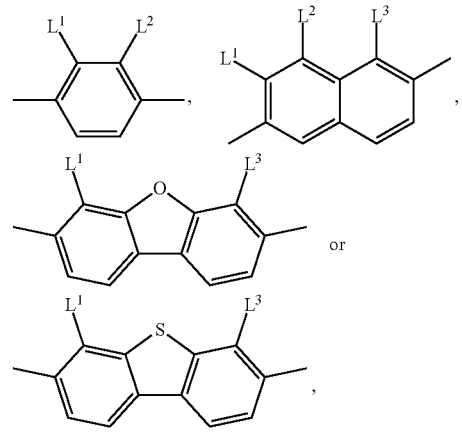

$D^1$ denotes adamantyl or diamantyl, in particular adamantyl, $L^1$ and $L^2$, independently of one another, denote Cl or F, where at least one of the radicals $L^1$ and $L^2$ denotes F, $L^3$ denotes F, $Y^1$ and $Y^2$, independently of one another, denote H, Cl or F, $Z^D$ denotes a single bond, —C≡C—, —C(O)O—, —OC(O)—, —$OCH_2$—, —$CH_2O$—, —$CH_2CH_2$—, —$CH_2CH_2CH_2$—, or —$CH_2CH_2CH_2CH_2$—, $Z^1$, $Z^2$, independently of one another, denote a single bond, —C(O)O—, —OC(O)—, —$CF_2O$—, —$OCF_2$—, —$CH_2O$—, —$OCH_2$—, —$CH_2CH_2$—, particularly preferably a single bond, Sp denotes unbranched 1,ω-alkylene having 1, 2, 3, 4, 5, 6, 7, 8, 9, 10, 11 or 12 C atoms, G denotes —OP(O)(OH)$_2$, —PO(OH)$_2$, or —COH(PO(OH)$_2$)$_2$.

In a further preferred embodiment, in the compounds of the formulae Ia to If,

Sp denotes unbranched 1,ω-perfluoroalkylene having 1 to 12 C atoms, where D$^1$, A$^1$, A$^2$, B$^1$, Z$^1$, Z$^2$, and G have the meanings indicated above.

Very particularly preferred sub-formulae of the formula I are the sub-formulae Ia, Ib and Id, in particular the following compounds:

Ia-1
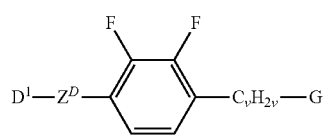

Ia-2
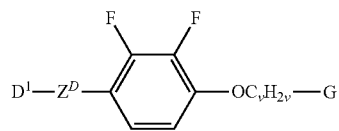

Ia-3
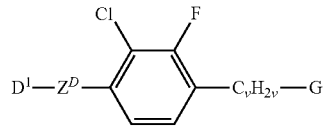

Ia-4
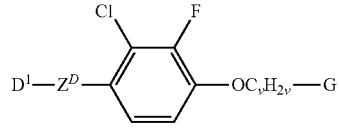

Ia-5
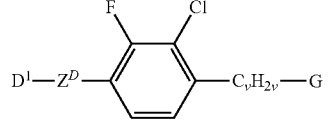

Ia-6
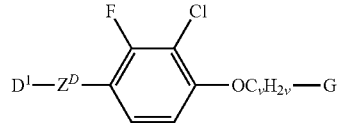

Ia-7
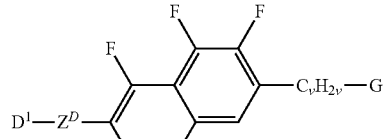

Ia-8
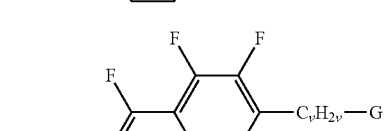

Ia-9
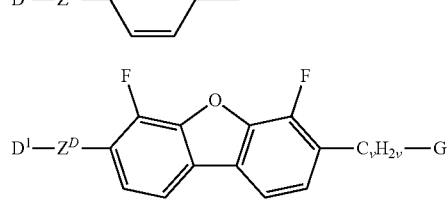

-continued

Ia-10
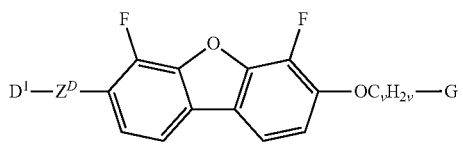

Ia-11
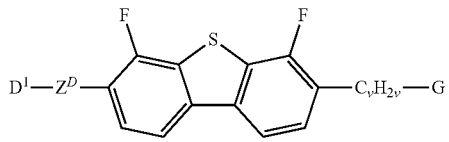

Ia-12
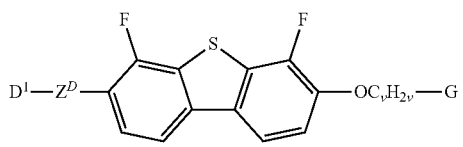

Ib-1
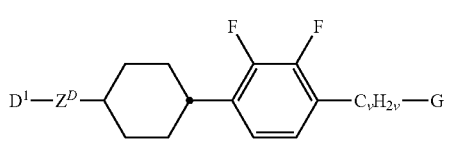

Ib-2
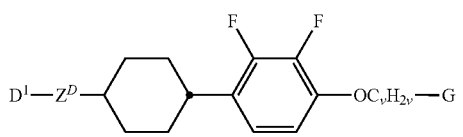

Ib-3
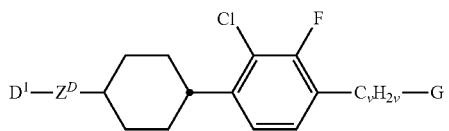

Ib-4
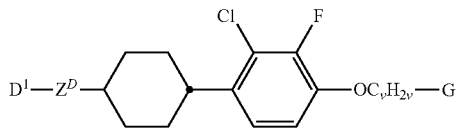

Ib-5
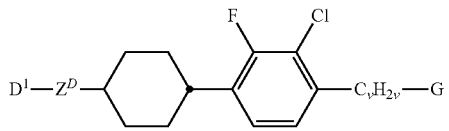

Ib-6
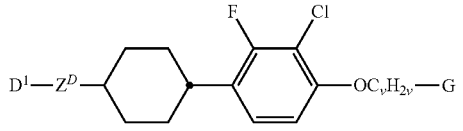

Ib-7
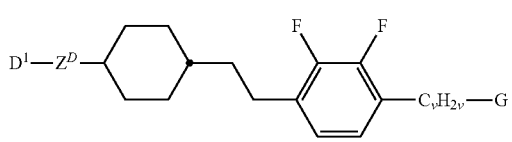

Ib-8
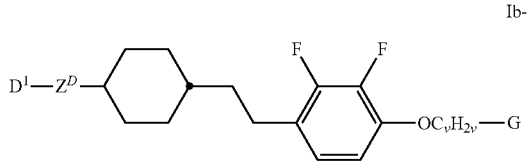

Ib-9
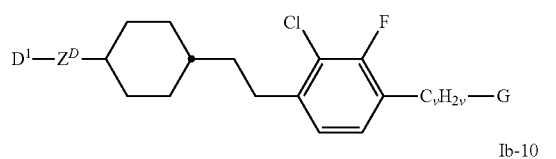
Ib-10
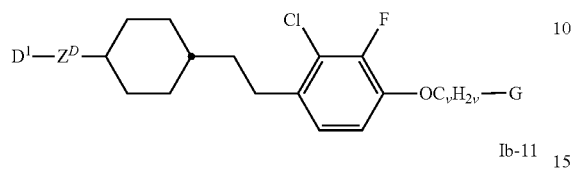
Ib-11
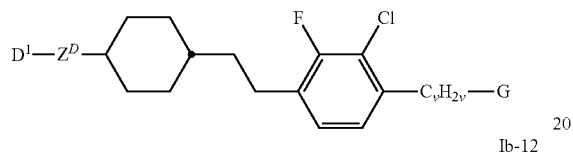
Ib-12
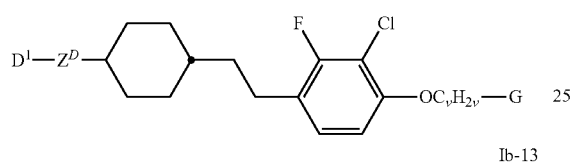
Ib-13
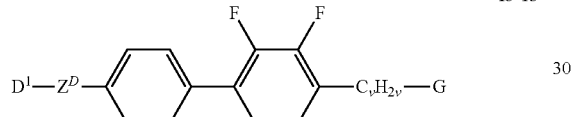
Ib-14
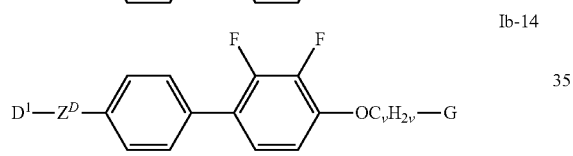
Ib-15
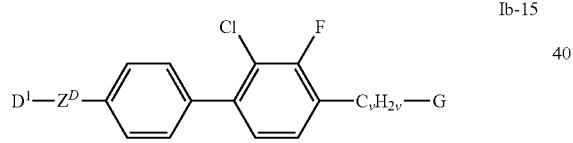
Ib-16
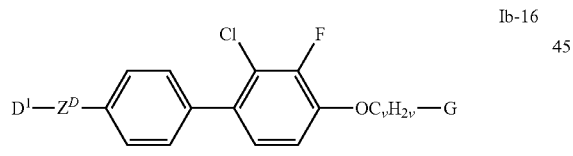
Ib-17
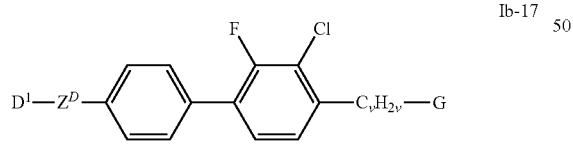
Ib-18
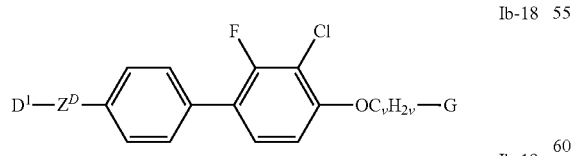
Ib-19
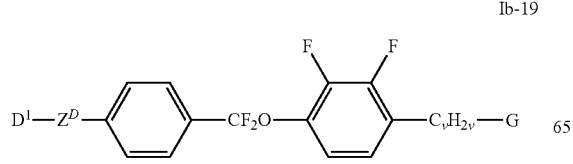
Ib-20
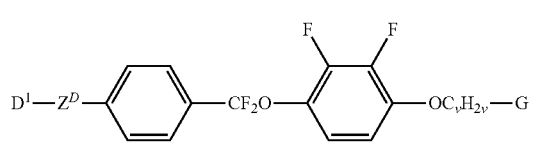
Ib-21
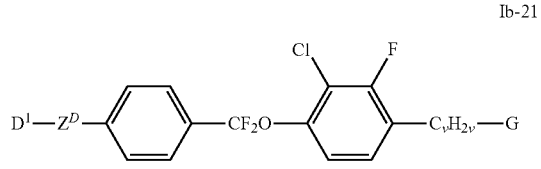
Ib-22
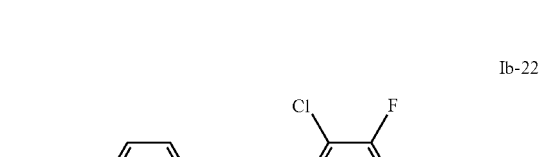
Ib-23
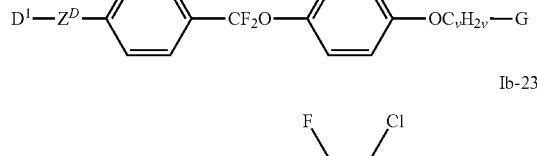
Ib-24
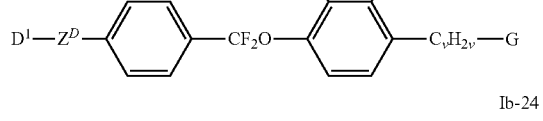
Id-1
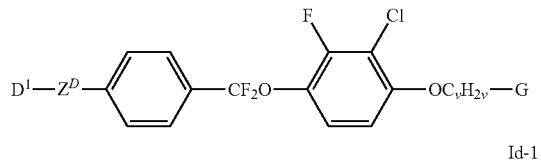
Id-2
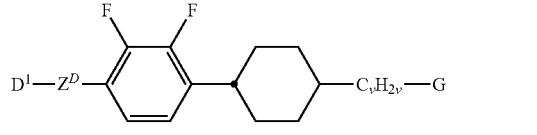
Id-3
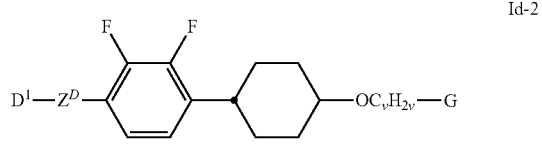
Id-4
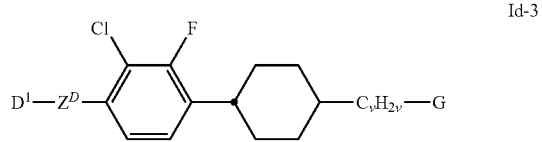
Id-5
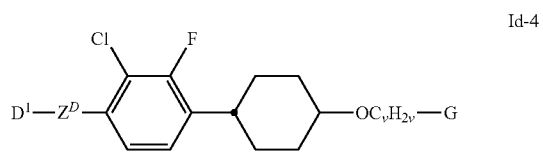
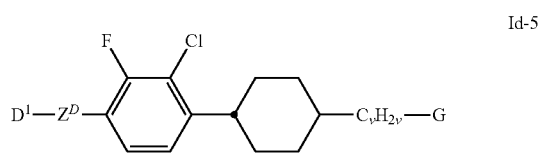

Id-6
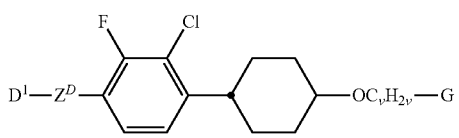

Id-7
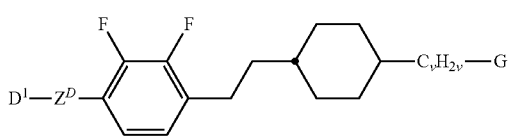

Id-8
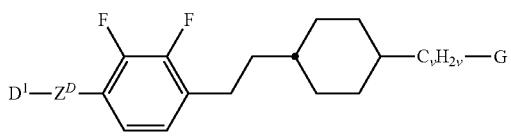

Id-9
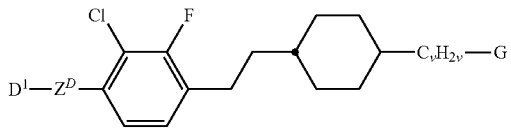

Id-10

Id-11

Id-12

Id-13

Id-14
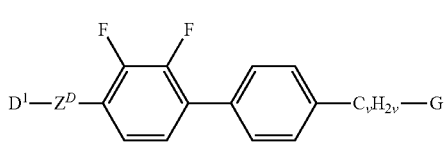

Id-15
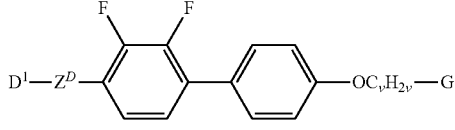

Id-16
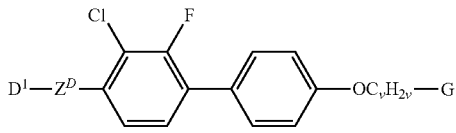

Id-17
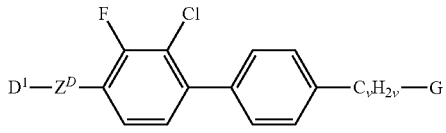

Id-18
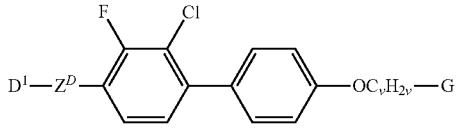

in which $D^1$, $Z^D$, and G have the meanings given above and preferably $D^1$ denotes adamantyl or diamantyl, $Z^D$ denotes —CH$_2$O—, —C≡C— or a single bond, G denotes —P(O)(OH)$_2$ or —COH(P(O)(OH)$_2$)$_2$, and in which v is an integer from 1 to 12, preferably from 2 to 7.

Also covered by the description are compounds of the formula I in which the group —C$_v$H$_{2v}$— has been replaced by —C$_v$F$_{2v}$— in the sub-formulae Ia-1 to Ia-12, Ib-1 to Ib-24, and Id-1 to Id-18.

According to another aspect of the invention there is provided a chiral non-racemic compound of formula I.

The molecular layers obtained from chiral compounds of formula I enable memristic devices with significantly reduced stochastic noise and faster switching, reducing the read and write error rate, which has a positive effect on energy-efficiency. In addition, increased tunnel currents are observed allowing for the integration to smaller junction sizes.

Preferably, the chiral compound has an enantiomeric excess (ee) of above 50%, preferably above 80%, 90%, 95%, more preferably above 97%, in particular above 98%.

Chirality is achieved by a branched chiral group Sp of formula I above having one or more, preferably one or two, very preferably one, asymmetrically substituted carbon atom (or: asymmetric carbon atom, C*), hereinafter referred to as Sp*.

In Sp* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical Sp* preferably has the formula

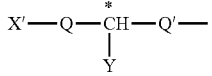

in which

X' has the meanings defined above for formula I and preferably denotes —CO—O—, —O—CO—, —O—CO—O—, —CO—, —O—, —S—, —CH=CH—, —CH=CH—COO— or a single bond, more preferably —CO—O—, —O—CO—, —O— or a single bond, very preferably —O— or a single bond, Q and Q' identically or differently, denote a single bond or optionally fluorinated alkylene having 1 to 10 carbon atoms, in which a $CH_2$ group not linked with X can also be replaced by —O—, —CO—, —O—CO—, —CO—O— or —CH=CH—, preferably alkylene having 1 to 5 carbon atoms or a single bond, particularly preferably —$(CH_2)_{n5}$—, or a single bond, n5 is 1, 2, 3, 4, 5, or 6, Y denotes optionally fluorinated alkyl having 1 to 15 carbon atoms, in which one or two non-adjacent $CH_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —$CH_3$, —$C_2H_5$, —$CF3$ or Cl, In an embodiment in which $Z^D$ in formula I is a chiral non-racemic spacer group, the group $D^1$-Sp* preferably has the formula

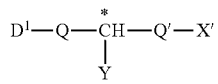

in which the occurring groups have the meanings given above.

The compounds of the general formula I are prepared by methods known per se, as described in the literature (for example in the standard works, such as Houben-Weyl, Methoden der organischen Chemie [Methods of Organic Chemistry], Georg-Thieme-Verlag, Stuttgart), to be precise under reaction conditions which are known and are suitable for the said reactions. Use can be made here of variants which are known per se, but are not mentioned here in greater detail. Chiral groups R* and Sp* are described in A. Taugerbeck, Ch. Booth, Design and Synthesis of Chiral Nematic Liquid Crystals, in: Handbook of Liquid Crystals, Volume 3, Part III, Chapter 14, Wiley VCH, Weinheim, 2014, and can preferably be synthesised according to the syntheses described therein or references cited therein.

Preferred synthetic pathways towards compounds according to the invention are shown in the schemes below and are further illustrated by means of the working examples. The syntheses can be adapted to the particular desired compounds of the general formula I by choice of suitable starting materials.

Suitable precursors for the diamondoid moiety are the corresponding diamondoid alcohols and hydroxyalkyl derivatives which are readily available by the methods described in H. Schwertfeger et al., Angew. Chem. Int. Ed. 2008, 47, 1022-1036; W. L. Yang et al., Science 2007, 316, 1460-1462; W. A. Clay et al., Nano Lett. 2009, 9, 57-61; et al., Langmuir 2013, 29, 9790-9797; K. T. Narasimha et al., Nat. Nanotechnol. 2015, 11, 267-272; A. A. Fokin et al., Synthesis 2017, 49, 2003-2008; M. A. Gunawan et al., Nanoscale 2015, 7, 1956-1962; P. Kahl et al., Synthesis 2014, 46,787-798; N. A. Fokina et al., Synthesis 2012, 44, 259-264; A. A. Fokin, et al., Chem. Eur. J. 2009, 15, 3851-3862.

The attachment of the diamondoid moiety to the main structure of the monolayer precursors can be achieved, e.g., by the following methods: direct derivatization of a phenol with diamondoid tertiary alcohols (cf. A. Koperniku et al., Lett. Org. Chem. 2016, 13, 171-176); reaction of aryl halides by Negishi coupling with diamondoid zinc (cf. C. Sāmann et al., Org. Lett. 2014, 16, 2418-2421); or from phenols with activated alkyl diamondoids via nucleophilic substitution (cf. R. G. Booth et al., J. Med. Chem. 1987, 30, 1218-1224; Angew. Chem. Int. Ed., 2014, 53, 9669-9673).

The above synthetic approaches are illustrated by way of example using adamantane derivatives in the following scheme. The reactions are likewise suitable for the transformation of higher diamondoids.

Typical preferred building blocks are for example accessible from adamantyl halide 1 (scheme 1), preferably adamantyl bromide, that can be reacted with phenols to give adamantyl phenols (3). Adamantyl halides are also used for the formation of zinc reagents (4) according to Ch. Sāmann et al., Org. Lett. 2014, 16, 2418-2421. These reagents undergo Negishi coupling reactions with a large range of commonly known aromatic compounds to give adamantyl aryl derivatives 5.

Scheme 1

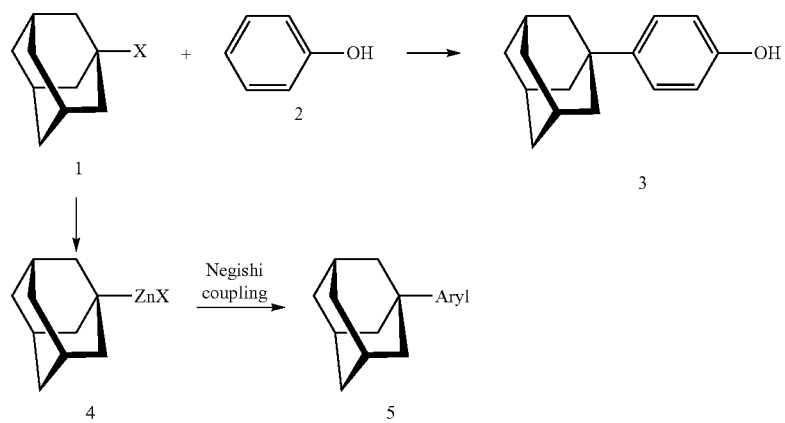

If desired, the starting materials can also be formed in situ by not isolating them from the reaction mixture, but instead immediately converting them further into the compounds of the general formula I.

Readily available adamantyl alcohol 6 can be transferred into aryl derivatives 5 by Friedel-Crafts reaction in the presence of trifluoro acetic acid (cf. Koperniku, Ana et al., Letters in Organic Chemistry, 13(3), 171-176; 2016). The alcohol 7 can be used e.g. for the derivatisation of phenols in a Williamson ether synthesis to give compounds 8.

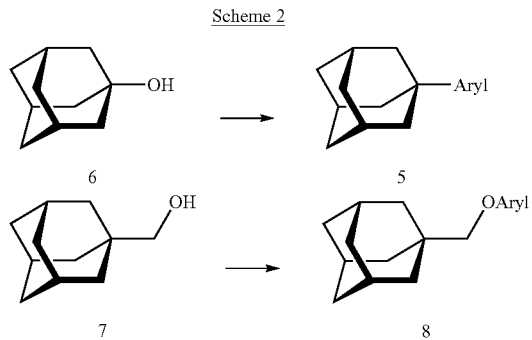

The known alkyne 9 (scheme 3) can be transferred into the phenylacetylene 10 also by Negishi coupling mentioned above and is a versatile building block for further well known transformations e.g. into phenol 11.

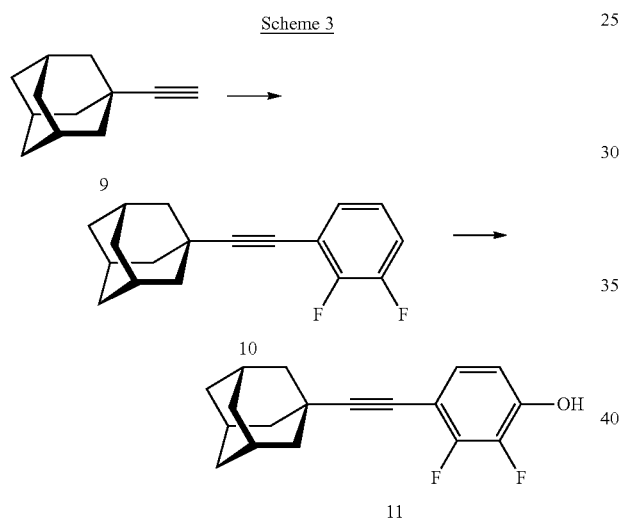

The phenol 3 provides access to cyclohexyl derivatives by hydrogenation (scheme 4)

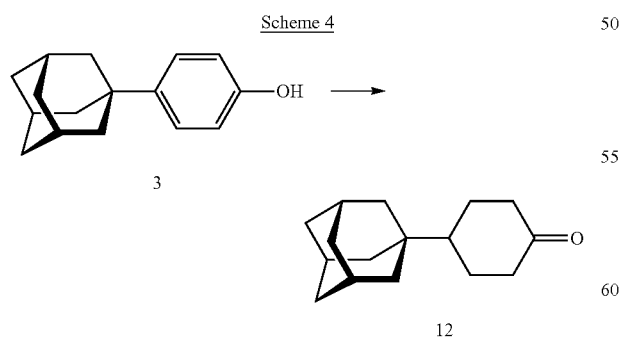

Anchor groups can be attached to the building blocks by preferred transformations known from the prior art cited above and as shown in the working examples. Other typical transformations are exemplified in scheme 5, e.g. phenol 3 can by alkylated with ω-bromocarboxylic esters followed by saponification to give compounds with a carboxylic acid anchor group (14) or etherification with protected alcohols such as (2,2-dimethyl-1,3-dioxan-5-yl)methanol yields alcohols such as compounds 16.

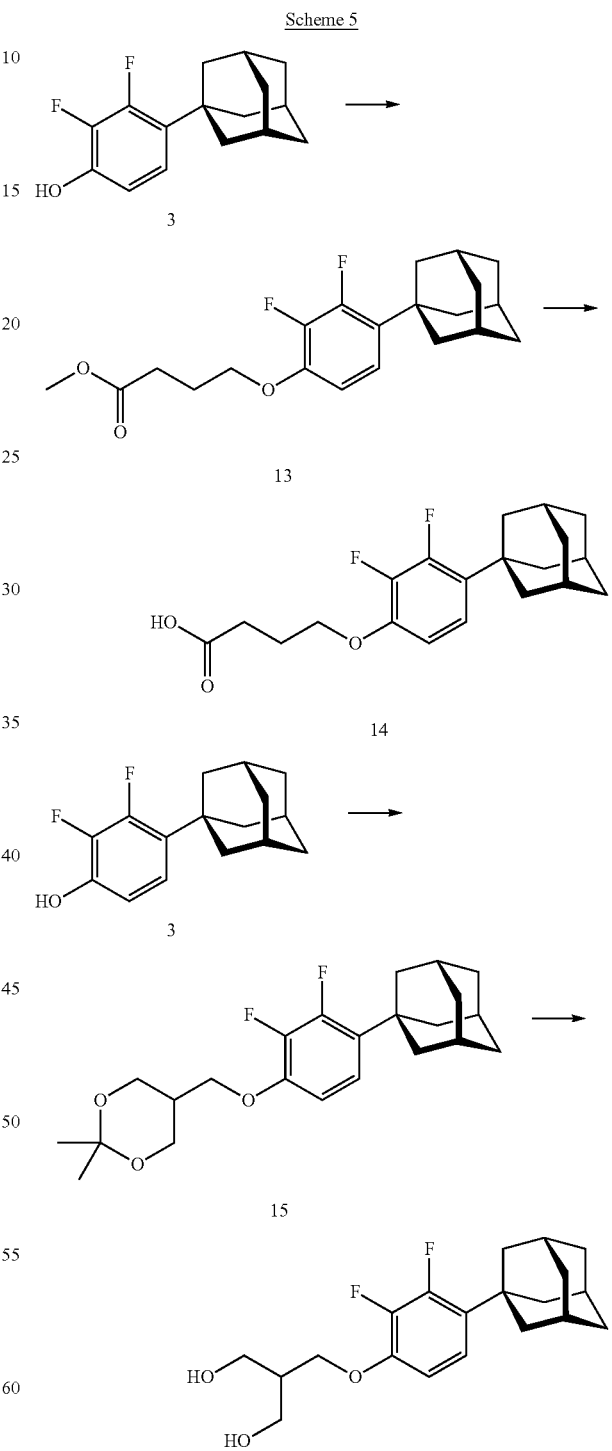

The invention furthermore relates to a process for the production of the switching element according to the invention comprising at least the following steps:
a) production of a first electrode with a surface,
b) deposition of a monolayer comprising one or more compounds of the formula I onto the surface of the first electrode,
c) application of a second electrode.

The deposition of the monolayer is carried out using the pure substance or from solution, preferably from solution. Suitable deposition methods and solvents are known to the person skilled in the art; examples are spin coating or dip coating.

According to another aspect of the invention the monolayer is fabricated from one or more compounds of formula I in which the anchor group G denotes —$SO_2OR^V$, —OP(O)($OR^V)_2$, —PO($OR^V)_2$, —C(OH)(PO($OR^V)_2)_2$, —CO-$OR^V$ or —Si($OR^V)_3$ where $R^V$ denotes alkyl having 1 to 20 C atoms, preferably a secondary or tertiary alkyl having up to 20 C atoms. These compounds are distinguished by a particularly high solubility and are well suitable for industrial processes such as spin coating. In addition, it is possible to process these compounds by gas phase deposition. The compounds serve as precursors for the corresponding free acids which are obtained in situ by thermal treatment of the compounds after deposition onto the first electrode. The first electrode is then heated to a temperature between 60° C. and 300° C., preferably between 100° C. and 250° C., in particular between 140° C. and 180° C.

In a preferred embodiment, the substrate is annealed after deposition of the molecular layer. The annealing is carried out at a temperature of greater than 20° C. and less than 300° C., preferably at greater than 50° C. and less than 200° C., particularly preferably at greater than 90° C. and less than 150° C. The time duration of the annealing is 1 to 48 h, preferably 4 to 24 h, particularly preferably 8 to 16 h.

The molecular layer of the present invention is a layer of electrically insulating, non-conducting and non-semiconducting organic compounds.

The molecular layer preferably comprises molecules of the formula I or, particularly preferably, consists of molecules of the formula I.

The thickness of the layer is preferably 10 nm or less, particularly preferably 5 nm or less, very particularly preferably 2 nm or less.

The molecular layer may consist of one, two, three or more molecule layers comprising compounds of the formula I.

The molecular layer employed in accordance with the invention is preferably a molecular monolayer.

In an embodiment, the molecular layer is a self-assembled monolayer (SAM).

The production of self-assembled monolayers is known to the person skilled in the art; a review is given, for example, in A. Ulman, Chem. Rev. 1996, 96, 1533-1554.

In a further embodiment, the molecular layer is bonded to the substrate by chemisorption, in particular by an addition reaction or condensation reaction.

In a further embodiment, the molecular layer is bonded to the substrate by physisorption.

The degree of coverage of the substrate is preferably 90% to 100%, particularly preferably 95% or more to 100%, very particularly preferably 98% or more to 100%.

In a further embodiment, the molecular layer is covered with 1 to 10, preferably 1 to 5, particularly preferably 1 to 3, further layers of organic or inorganic adsorbates. Suitable layers comprise, for example, dielectrics, for example oxidic, fluoridic or nitridic materials, such as $TiO_2$, $Al_2O_3$, $HfO_2$, $SiO_2$, LiF and $Si_3N_4$, or metals, such as Pt, Pd, Pb, Au, Ag, Cu, Al and Mg, and eutectic compounds thereof, such as, for example, PdAu 20:80. Such layers can be built up in a thickness of a few nanometres by defined and high-precision deposition, for example by ALD (atomic layer deposition) processes.

The molecules of the molecular layer are preferably covalently bonded to the substrate. The bonding is carried out by known methods which are familiar to the person skilled in the art, for example by the addition reaction of a compound of the formula I or by esterification with hydroxyl groups located on the surface of the substrate.

For addition reactions, a suitable substrate, preferably a silicon surface—after corresponding pre-treatment with aqueous $NH_4F$ solution—can, for example, be treated in order to obtain a hydrogen-terminated surface. The surface treated in this way can then be treated at elevated temperature with exclusion of oxygen either directly with a suitable liquid compound of the formula I or a solution of the compound of the formula I in a suitable solvent. According to this aspect of the invention the group G in formula I preferably denotes —CH=$CH_2$.

For condensation reactions, a suitable substrate, preferably a silicon surface, can, for example, be treated with oxygen plasma in order to obtain a hydrophilic oxidic surface which is populated with hydroxyl groups. The surface treated in this way can then be reacted at elevated temperature either directly with a suitable, liquid compound of the formula I or a solution of the compound of the formula I in a suitable solvent. It is clear that an oxidic surface of this type merely serves for surface modification with the aim of possible derivatisation via condensation reactions and does not represent an insulator layer in the true sense. Sufficiently large tunnel currents through this oxidic surface are possible owing to the low thickness in the order of 1 nm.

In the switching elements according to the invention, the molecules of the molecular layer are bonded to a substrate or an interlayer located between the molecular monolayer and the substrate. The substrate according to the invention can perform various functions, depending on the structure of the switching elements. For example, a conductive substrate can serve as first electrode. Likewise, the substrate can be a layer of a diode.

Suitable substrates are known to the person skilled in the art. Particularly suitable substrates are selected from:
element semiconductors, such as Si, Ge, C (diamond, graphite, graphene, fullerene), α-Sn, B, Se and Te;
compound semiconductors, preferably
group III-V semiconductors, in particular GaAs, GaP, InP, InSb, InAs, GaSb, GaN, TaN, TiN, MoN, WN, AlN, InN, $Al_xGa_{1-x}As$ and $In_xGa_{1-x}Ni$,
group II-VI semiconductors, in particular ZnO, ZnS, ZnSe, ZnTe, CdS, CdSe, CdTe, $Hg_{(1-x)}Cd_{(x)}Te$, BeSe, $BeTe_x$ and HgS;
group III-VI semiconductors, in particular GaS, GaSe, GaTe, InS, $InSe_x$ and InTe,
group I-III-VI semiconductors, in particular $CuInSe_2$, $CuInGaSe_2$, $CuInS_2$ and $CuInGaS_2$,
group IV-IV semiconductors, in particular SiC and SiGe,
group IV-VI semiconductors, in particular SeTe;
organic semiconductors, in particular polythiophene, tetracene, pentacene, phthalocyanines, PTCDA, MePTCDI, quinacridone, acridone, indanthrone, flaranthrone, perinone, AlQ$_3$, and mixed systems, in particular PEDOT:PSS and polyvinylcarbazole/TLNQ complexes;

metals, in particular Ta, Ti, Co, Mo, Pt, Ru, Au, Ag, Cu, Al, W and Mg;

conductive oxidic materials, in particular indium tin oxide (ITO), indium gallium oxide (IGO), InGa-α-ZnO (IGZO), aluminium-doped zinc oxide (AZO), tin-doped zinc oxide (TZO), fluorine-doped tin oxide (FTO) and antimony tin oxide.

The molecular layer may optionally also be bonded to a thin (preferably 0.5-5 nm thick) oxidic or fluoridic interlayer, for example TiO$_2$, Al$_2$O$_3$, HfO$_2$, SiO$_2$ or LiF, which is located on the substrate.

The counter electrode or second electrode consists of a conducting or semi-conducting material or a combination (layer stack) of a plurality of these materials. Examples are the materials mentioned as substrate material. Preference is given to Hg, In, Ga, InGa, Ag, Au, Cr, Pt, PdAu, Pb, Al, Mg, W, Yb, Zn, CNT (carbon nanotubes), graphene and conductive polymers (such as PEDOT:PSS).

The production and structuring of the electrodes is carried out by means of processes known to the person skilled in the art. The fabrication and electrical characterisation of switching elements comprising a molecular layer obtained from one or more compounds of formula I is carried out according to procedures described in WO 2016/110301 A1 and WO 2018/007337 A2.

EXAMPLES

Synthesis Example 1: 3-[4-(1-adamantyl)-2,3-difluoro-phenoxy]propyl-phosphonic acid Step 1: 4-(1-adamantyl)-2,3-difluoro-phenol

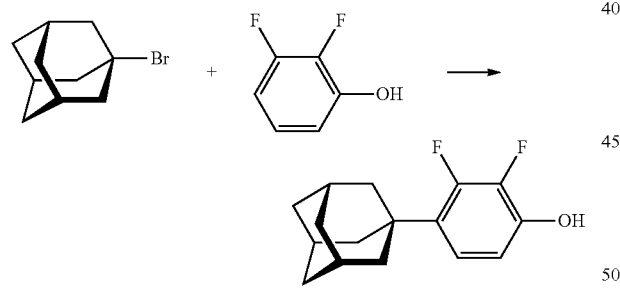

1-bromoadamantane (98.8 g, 0.459 mol) is added portionwise over 5 min to molten 2,3-difluorophenol (478 g, 3.67 mol) at 50° C. under nitrogen, and heated at 120° C. overnight. The reaction mixture is cooled to 80° C. and poured into hot water (4 L), stirred for 30 min, cooled to 50° C., filtered and dried to give an off-white solid. The solid is stirred in water (1.5 L) at 55° C. for 1 hour, filtered, washed with hot water (3×500 mL) and is recrystallized from acetonitrile to give 4-(1-adamantyl)-2,3-difluoro-phenol as a white solid.

$^1$H NMR (400 MHz, CHCl$_3$-d) δ ppm 1.78 (6 H, t, J=2.9 Hz), 2.01 (6 H, d, J=2.4 Hz), 2.09 (3 H, br s), 6.71 (1 H, td, J=8.5 Hz, 2.1 Hz), 6.86 (1 H, td, J=8.6 Hz, 2.3 Hz).

$^{13}$C NMR (400 MHz, DMSO-d) δ ppm 28.3, 35.6 (dd, J=2.9 Hz, 1.5 Hz), 36.3, 41.0 (d, J=3.7 Hz), 111.9 (m), 120.1 (dd, J=7.0 Hz, 4.0 Hz), 128.4 (dd, J=8.1 Hz, 2.2 Hz), 140.4 (dd, J=241.4, 16.1 Hz), 144.6 (dd, J=9.5 Hz, 2.9 Hz), 150.5 (d, J=246.9 Hz, 10.7 Hz).

$^{19}$F NMR (400 MHz, CHCl$_3$-d) δ ppm −164.38 (1 F, d, J=19.1 Hz), −136.19 (1 F, d, J=19.1 Hz).

Step 2: 1-[4-(3-diethoxyphosphorylpropoxy)-2,3-difluoro-phenyl]adamantane

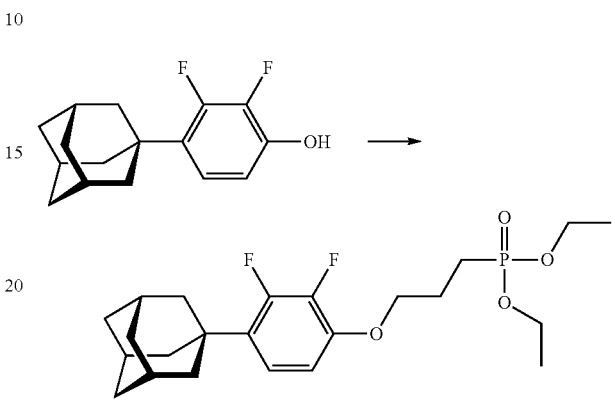

To a solution of 4-(1-adamantyl)-2,3-difluoro-phenol (5.72 g, 21.65 mmol) and diethyl(3-bromopropyl)phosphonate (6.2 g, 22.73 mmol) in methyl ethyl ketone (73 mL), potassium carbonate (11.97 g, 86.6 mmol) is added and the mixture is heated at reflux overnight, cooled to 40° C., filtered and the solids washed with acetone. The filtrates are concentrated to dryness under vacuum to give a colorless oil which is purified on silica with ethyl acetate/DCM (0-50%) to give 1-[4-(3-diethoxyphosphorylpropoxy)-2,3-difluoro-phenyl]adamantane as a colorless solid.

$^1$H NMR (400 MHz, CHCl$_3$-d) δ ppm 1.32 (6 H, t, J=7.0 Hz), 1.77 (6 H, m), 1.90-2.14 (13 H, m), 4.06-4.16 (6 H, m), 6.62-6.67 (1 H, m), 6.84 (1 H, td, J=8.4 Hz, 2.4 Hz).

$^{19}$F NMR (400 MHz, CHCl$_3$-d) δ ppm −159.52 (1 F, d, J=17.7 Hz), −136.00 (1 F, d, J=17.7 Hz).

$^{31}$P NMR (400 MHz, CHCl$_3$-d) δ ppm 31.55

Step 3: 3-[4-(1-adamantyl)-2,3-difluoro-phenoxy]propylphosphonic acid

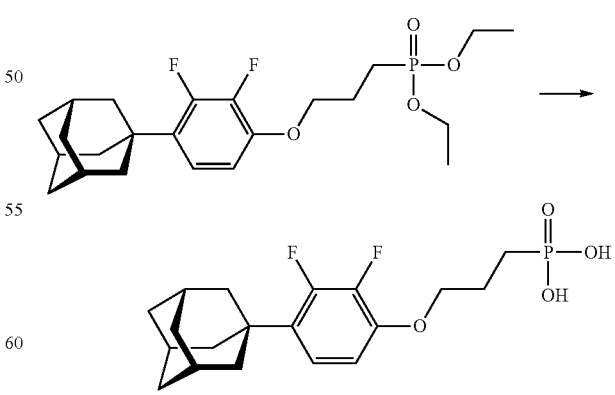

To a solution of 1-[4-(3-diethoxyphosphorylpropoxy)-2,3-difluoro-phenyl]adamantane (5.53 g, 12.50 mmol) in dichloromethane (83.0 mL), trimethylsilyl bromide (19.1 g, 125.0 mmol) is added dropwise over 10 min and the solution is stirred overnight at room temperature. The reaction mixture is concentrated to dryness, dichloromethane (110 mL) and methanol (55 mL) are added and the dichloromethane is removed slowly. Once no further solvent distilled, the remaining solution is stirred at room temperature and a solid precipitated out on cooling. The mixture is stirred at 0-5° C. for 1 hour then the solid is filtered-off and washed with methanol to give 3-[4-(1-adamantyl)-2,3-difluoro-phenoxy] propylphosphonic acid as a white solid.

$^1$H NMR (400 MHz, THF-d) δ ppm 1.78-1.86 (8 H, m), 2.03-2.10 (11 H, m), 4.10 (2 H, t, J=6.4 Hz), 6.77-6.82 (1 H, m), 6.87-6.92 (1 H, m).

$^{19}$F NMR (400 MHz, THF-d) δ ppm −162.95 (1 F, d, J=17.7 Hz), −139.85 (1 F, d, J=17.7 Hz).

$^{31}$P NMR (400 MHz, THF-d) δ ppm 29.69.

ES (-ve) MS: m/z=385.1382, 100% [M-H]$^-$, $C_{19}H_{24}F_2O_4P^-$ requires 385.1380.

Synthesis Example 2

Step 1: 11-[4-(1-adamantyl)-2,3-difluoro-phenoxy]undecan-1-ol

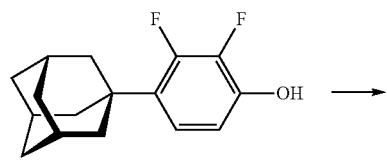

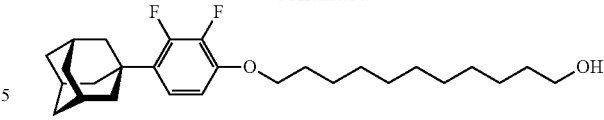

To a solution of 4-(1-adamantyl)-2,3-difluoro-phenol (7.0 g, 26.5 mmol) and 11-bromoundecanol (7.0 g, 27.8 mmol) in methyl ethyl ketone (88 mL) potassium carbonate (14.6 g, 105.9 mmol) is added portionwise and the mixture is heated at reflux overnight. The solids are washed with acetone and the filtrates are concentrated to dryness under vacuum at 40° C. to give a white solid (11.8 g). Recrystallisation from heptane yields 11-[4-(1-adamantyl)-2,3-difluoro-phenoxy]undecan-1-ol as a white solid.

$^1$H NMR (400 MHz, CHCl$_3$-d) δ ppm 1.25-1.40 (12 H, m), 1.42-1.49 (4 H, m), 1.58 (2 H, m), 1.78-1.84 (8 H, m), 2.01 (6 H, d, J=2.3 Hz), 2.09 (3 H, br s), 3.65 (2 H, t, J=6.5 Hz), 4.01 (2 H, t, J=6.5 Hz), 6.65 (1 H, m), 6.85 (1 H, td, J=8.7 Hz, 2.4 Hz).

$^{13}$C NMR (400 MHz, CHCl$_3$-d) δ ppm 25.68, 25.84, 28.80, 29.14, 29.27, 29.37, 29.45, 29.47, 29.53, 32.66, 36.21 (dd, J=3.3 Hz, 1.8 Hz), 36.74, 41.28 (d, J=3.7 Hz), 63.01, 69.66, 108.57 (d, J=2.2 Hz), 119.58 (dd, J=7.3 Hz, 4.4 Hz), 131.24 (dd, J=8.4 Hz, 1.8 Hz), 142.0 (dd, J=246 Hz, 15.8 Hz), 146.38 (dd, J=8.1 Hz, 2.9 Hz), 151.1 (dd, J=250 Hz, 10.3 Hz).

$^{19}$F NMR (400 MHz, CHCl$_3$-d) δ ppm −159.38 (1 F, d, J=17.7 Hz), −136.25 (1 F, d, J=17.7 Hz).

Step 2: 1-[4-(11-bromoundecoxy)-2,3-difluoro-phenyl]adamantane

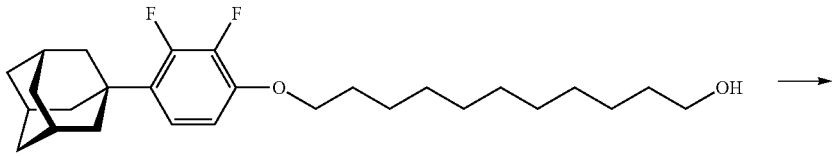

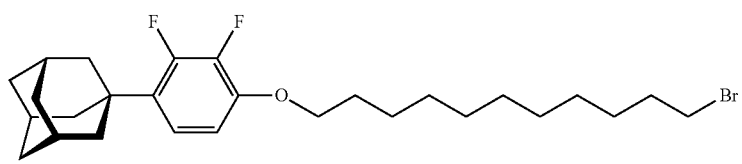

11-[4-(1-adamantyl)-2,3-difluoro-phenoxy]undecan-1-ol (10.5 g, 24.16 mmol) and triphenylphosphine (8.81 g, 26.58 mmol) in dichloromethane (105 mL) are cooled to 2° C. Carbon tetrabromide (8.81 g, 26.58 mmol) is added portionwise over 10 min and the reaction is stirred at room temperature overnight. Further triphenylphosphine (1.90 g) and carbon tetrabromide (2.4 g) are added in one portion in quick succession. The reaction mixture is concentrated to dryness, heptane (250 mL) is added and stirred at 50° C. for 45 min. The solids are filtered off and washed with hot heptane. The filtrates are combined and concentrated under vacuum at 50° C. giving a solid. Heptane (140 mL) is added and filtered through a pad of silica and the pad is washed with hot heptane (700 mL). The filtrates are concentrated to dryness giving a solid. This is recrystallized from heptane to give 1-[4-(11-bromoundecoxy)-2,3-difluoro-phenyl]adamantane as an off-white solid.

$^1$H NMR (400 MHz, CHCl$_3$-d) δ ppm 1.25-1.38 (10 H, m), 1.39-1.51 (4 H, m), 1.76-1.91 (10 H, m), 2.01 (6 H, d, J=2.5 Hz), 2.09 (3 H, br. s.), 3.42 (2 H, t, J=6.9 Hz), 4.01 (2 H, t, J=6.5 Hz), 6.65 (1 H, m), 6.85 (1 H, td, J=8.7, 2.5 Hz).

$^{13}$C NMR (400 MHz, CHCl$_3$-d) δ ppm 25.84, 28.13, 28.72, 28.81, 29.15, 29.28, 29.37, 29.40, 29.44, 32.80, 33.99, 36.22 (dd, J=2.9 Hz, 1.5 Hz), 36.76, 41.29 (d, J=2.9 Hz), 69.66, 108.58 (m), 119.58 (dd, J=7.3, 4.4 Hz), 131.24 (dd, J=8.8, 2.2 Hz), 142.00 (dd, J=245.8 Hz, 16.1 Hz), 146.39 (dd, J=8.4, 2.6 Hz), 151.09 (dd, J=249.4 Hz, 11.0 Hz).

$^{19}$F NMR (400 MHz, CHCl$_3$-d) δ ppm −159.76 (d, J=17.71 Hz), −136.24 (d, J=17.71 Hz)

Step 3: 11-[4-(1-adamantyl)-2,3-difluoro-phenoxy]undecylphosphonic acid

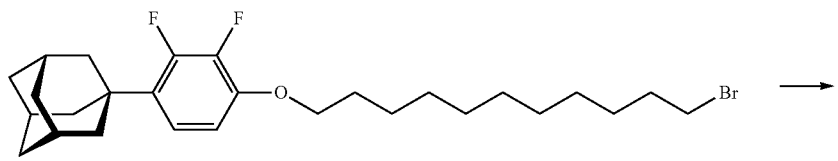

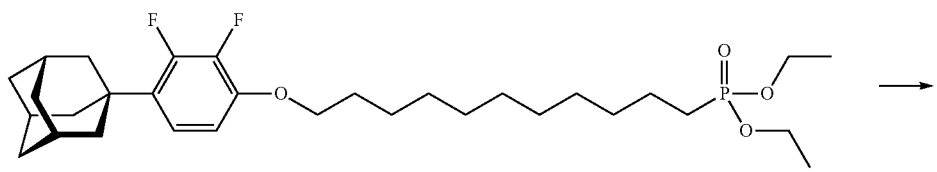

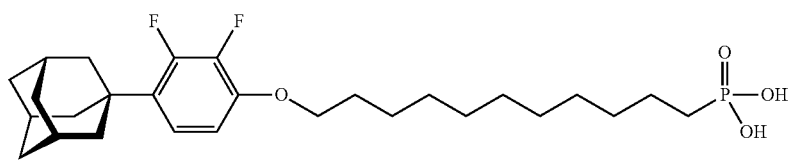

1-[4-(11-bromoundecoxy)-2,3-difluoro-phenyl]adamantane (8.2 g, 16.5 mmol) and triethyl phosphite (8.21 g, 49.45 mmol) are heated at 135° C. under nitrogen for 70 h. A further portion of triethyl phosphite (1.4 g, 8.3 mmol) is added and the reaction is heated overnight at 145° C. Another 1.4 g (8.3 mmol) of triethylphosphite is added and the reaction mixture is heated for a 24 h. The reaction is evaporated under reduced pressure, the crude 1-[4-(11-diethoxyphosphorylundecoxy)-2,3-difluoro-phenyl]adamantane is dissolved in dichloromethane (137 mL), trimethylsilyl bromide (75.7 g, 494 mmol) is added dropwise over 15 min and the solution is stirred overnight. The reaction is concentrated to dryness in vacuo. Dichloromethane (180 mL) and methanol (90 mL) are added to the solid and the dichloromethane is removed slowly until no further solvent distilled. The solution is cooled to −5° C. and stirred for 30 min. The precipitate is filtered off, washed with cold methanol and dried to give 11-[4-(1-adamantyl)-2,3-difluoro-phenoxy]undecylphosphonic acid as a white solid which is recrystallised from THF/heptane.

$^1$H NMR (400 MHz, THF-d8) δ ppm 1.25-1.43 (12 H, m), 1.43-1.52 (2 H, m), 1.52-1.65 (4 H, m), 1.75-1.85 (8 H, m), 1.97-2.12 (9 H, m), 4.01 (2 H, t, J=6.5 Hz), 6.73-6.81 (1 H, m), 6.89 (1 H, td, J=8.8 Hz, 2.3 Hz).

$^{19}$F NMR (400 MHz, THF-d8) δ ppm −161.2 (1 F, d, J=17.7 Hz), −138.1 (1 F, d, J=17.7 Hz).

$^{31}$P NMR (400 MHz, THF-d8) δ ppm 32.5.

ES (-ve) MS: m/z=497.2623, 100% [M-H]$^−$, $C_{27}H_{40}F_2O_4P^−$ requires 497.2632.

Synthesis Example 3

Step 1: 1-adamantylmethyl methanesulfonate

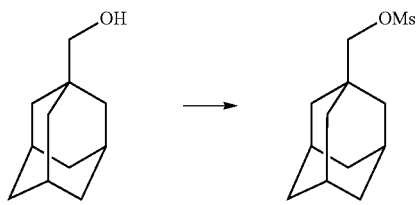 [SMILES: OCC12CC3CC(CC(C3)C1)C2 ; CS(=O)(=O)OCC12CC3CC(CC(C3)C1)C2]

1-Adamantyl methanol (163 g, 0.98 mol) is dissolved in dichloromethane (1.9 L) and then mesyl chloride (124 g, 1.08 mol) is added under ice cooling. Triethylamine (198 g, 1.98 mol) is added dropwise. The reaction mixture is allowed to warm to room temperature and stirred overnight. The mixture is filtered and the white solid is washed with dichloromethane. The filtrates are stirred with HCl (81 mL 37% diluted to 1 L) for 30 min, then the organics are separated and stirred overnight with aq. Na$_2$CO$_3$ (500 mL). The organic phase is separated, dried over MgSO$_4$, filtered and the solvent removed to yield 1-adamantylmethyl methanesulfonate as an off-white solid.

$^1$H NMR (400 MHz, CHCl$_3$-d) δ ppm 1.57 (d, J=2.32 Hz, 6 H) 1.62-1.68 (m, 3 H) 1.71-1.78 (m, 3 H) 2.02 (br. s., 3 H) 3.00 (s, 3 H) 3.78 (s, 2 H)

Step 2: 1-[(4-bromo-2,3-difluoro-phenoxy)methyl]adamantane

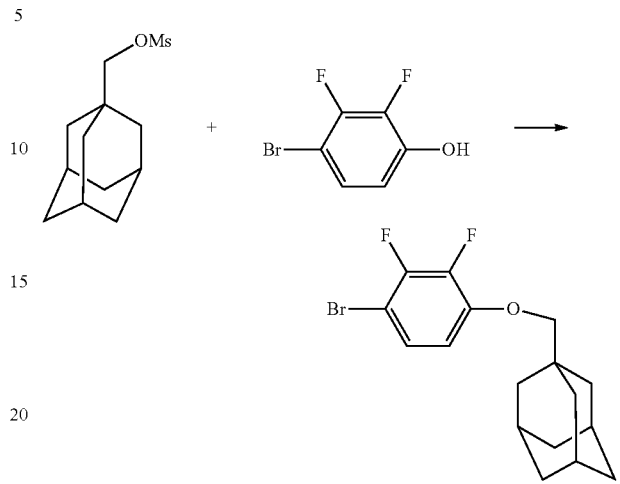

4-Bromo-2,3-difluorophenol (50 g, 240 mmol) is dissolved in dimethylformamide (500 mL). K$_2$CO$_3$ (66 g, 480 mmol) is added, followed by adamantan-1-ylmethyl methanesulfonate (70 g, 288 mmol) is added and the reaction is stirred for 36 h at 120° C. The mixture is poured onto water (1 L) and extracted with dichloromethane. The organic layer is washed with brine, dried over MgSO$_4$, filtered and the solvent is removed. The crude material is filtered through silica with heptane to give 1-[(4-bromo-2,3-difluoro-phenoxy)methyl]adamantane as a colorless solid.

Step 3: [4-(1-adamantylmethoxy)-2,3-difluoro-phenyl]boronic acid

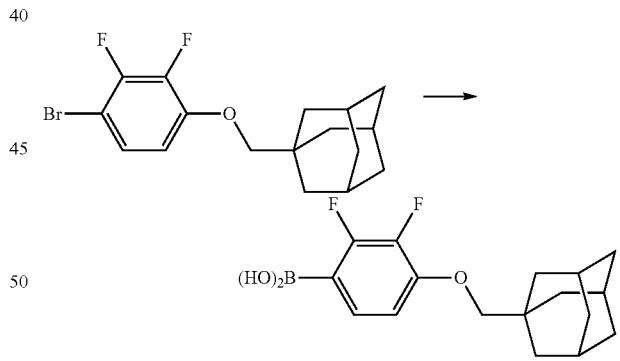

To 1-[(4-bromo-2,3-difluoro-phenoxy)methyl]adamantane (59.3 g, 116 mmol) in THF (600 mL) under nitrogen n-butyl lithium (2.5 M, 76 mL, 183 mmol) is added dropwise at −70° C. within 1 h. The reaction is stirred at −70° C. for 1 hour, then trimethylborate (24 mL, 216 mmol) is added and the reaction is allowed to warm slowly to room temperature and is stirred overnight. Water (200 mL) is added and the mixture is poured onto dilute HCl and stirred for 30 min. The organic phase is separated and the aqueous extracted with MTB ether (200 mL). The combined organic layers are washed with brine, dried over MgSO$_4$, filtered and the solvent removed. The crude material is suspended in dichloromethane and is purified by chromatography on silica with dichloromethane followed by 5% methanol in THF. [4-(1-adamantylmethoxy)-2,3-difluoro-phenyl]boronic acid is obtained as a yellow amorphous solid.

$^{1}$H NMR (400 MHz, CHCl$_{3}$-d) δ ppm 1.67 (d, J=2.08 Hz, 6 H) 1.69-1.74 (m, 3 H) 1.75-1.81 (m, 3 H) 2.04 (br. s., 3 H) 3.55 (s, 2 H) 6.62-6.69 (m, 1 H) 7.18 (ddd, J=9.14, 7.12, 2.32 Hz, 1 H)

Step 4: 4-(1-adamantylmethoxy)-2,3-difluorophenol

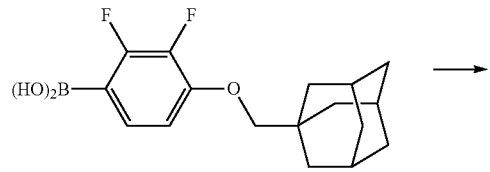

[4-(1-adamantylmethoxy)-2,3-difluoro-phenyl]boronic acid (43 g, 133 mmol) is dissolved in THF (400 mL) then acetic acid (16 mL 280 mmol) in 40 mL water is added and stirred for 5 min. Hydrogen peroxide (30.3 mL 30% solution) is added dropwise over 10 min and the reaction is stirred at room temperature overnight. Bisulfite solution (270 mmol in 600 mL) is added. The mixture is allowed to cool to room temperature and the organic phase is separated. The aqueous phase is extracted with MTB ether (200 mL) and the combined organics are washed with dilute bisulfite, water and brine, are dried over MgSO$_{4}$. The solvent is removed and the crude material is recrystallised from dichloromethane/heptane to give 4-(1-adamantylmethoxy)-2,3-difluorophenol.

1H NMR (400 MHz, CDCl$_{3}$-d) δ ppm 1.67 (d, J=2.32 Hz, 6 H) 1.68-1.74 (m, 3 H) 1.74-1.80 (m, 3 H) 2.03 (br. s., 3 H) 3.52 (s, 2 H) 4.76 (br. s., 1 H) 6.50-6.80 (m, 2 H).

Step 5: 1-[[4-(3-bromopropoxy)-2,3-difluoro-phenoxy]methyl]adamantane

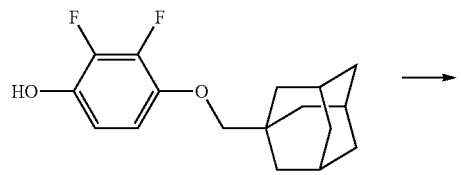

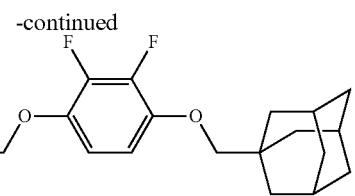

To a solution of 4-(1-adamantylmethoxy)-2,3-difluorophenol (4.00 g, 13.6 mmol) in acetone (50 mL) potassium carbonate (2.20 g, 15.9 mmol) is added followed by 1,3-dibromopropane (6.90 mL, 67.9 mmol). The mixture is heated at reflux for 15 h, filtered and the filtrate is concentrated under reduced pressure. The residue is purified by silica gel chromatography with increasing amounts of dichloromethane to give 1-[[4-(3-bromopropoxy)-2,3-difluoro-phenoxy]methyl]adamantane as a pale yellow oil.

Step 6: 1-[[4-(3-di-tert-butoxyphosphorylpropoxy)-2,3-difluoro-phenoxy]methyl]adamantane

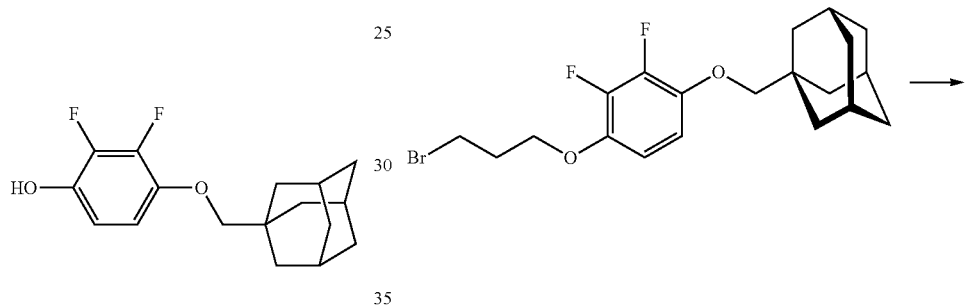

To di-tert-butylphosphite (2.9 mL, 14.5 mmol) in THF (30 mL), sodium hydride (60% suspension in mineral oil; 581 mg, 14.5 mmol) is added portionwise and the mixture is stirred at room temperature for 45 min. A solution of 1-[[4-(3-bromopropoxy)-2,3-difluoro-phenoxy]methyl]-adamantane (3.45 g, 8.30 mmol) in THF (30 mL) is added and the mixture is heated under reflux for 15 h, cooled and quenched with water. MTB ether (200 mL) and water (200 mL) are added and the layers are separated. The aqueous layer is extracted with MTB ether; the organic layers are combined and washed with water, brine, are dried (MgSO$_{4}$), filtered and concentrated under reduced pressure. Excess di-tert-butylphosphite is removed via Kugelrohr distillation at 50° C. and 10 mbar and the crude product is purified by silica gel chromatography using 0% to 100% EtOAc in CH$_{2}$Cl$_{2}$ as eluent. 1-[[4-(3-ditert-butoxyphosphorylpropoxy)-2,3-difluoro-phenoxy]methyl]adamantane is obtained as a waxy colorless solid.

In analogy to Synthesis Example 1 the following compounds are obtained:
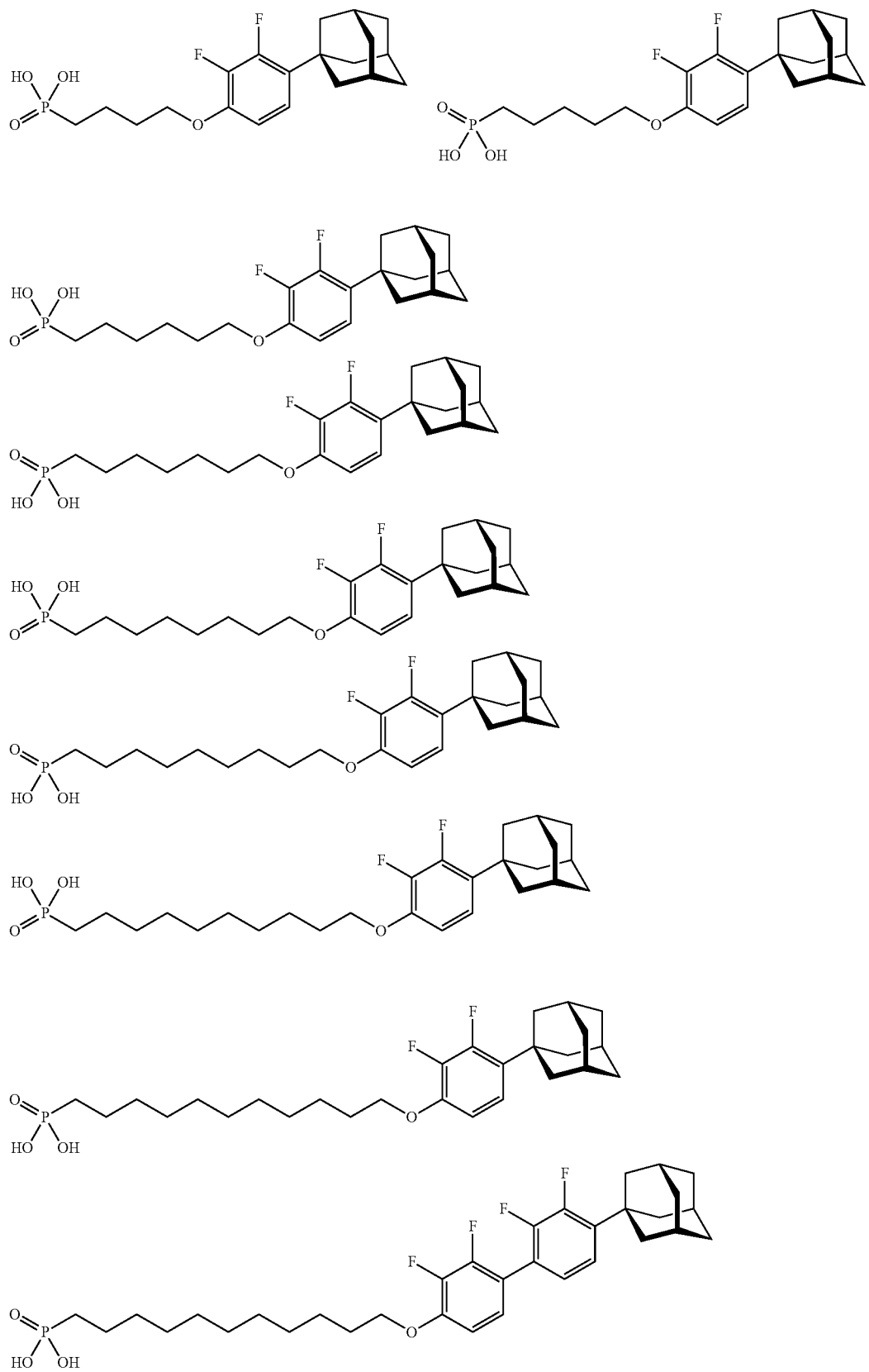

-continued
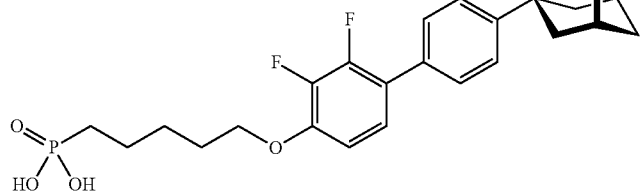
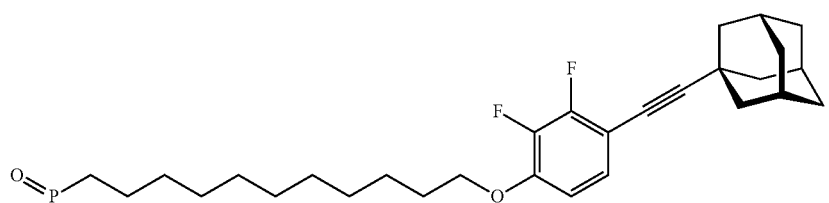
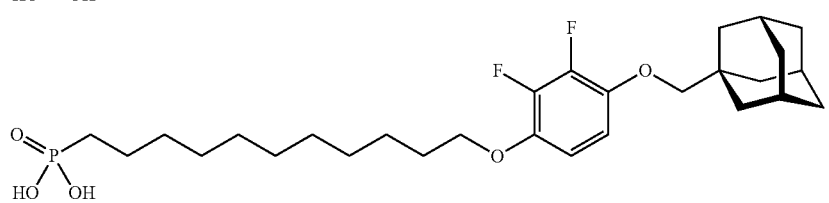
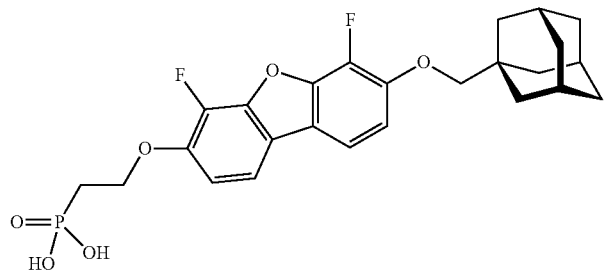
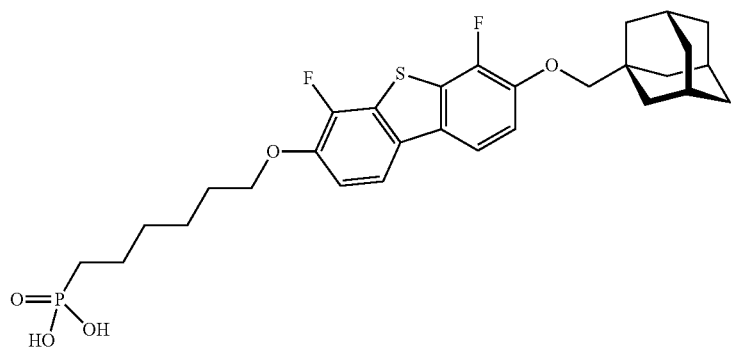
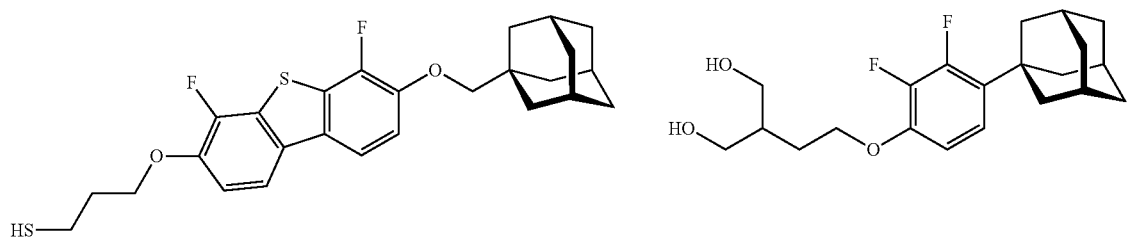

-continued
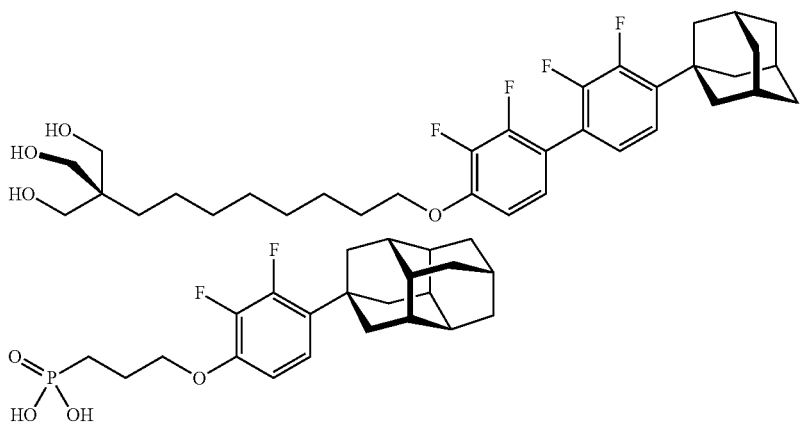
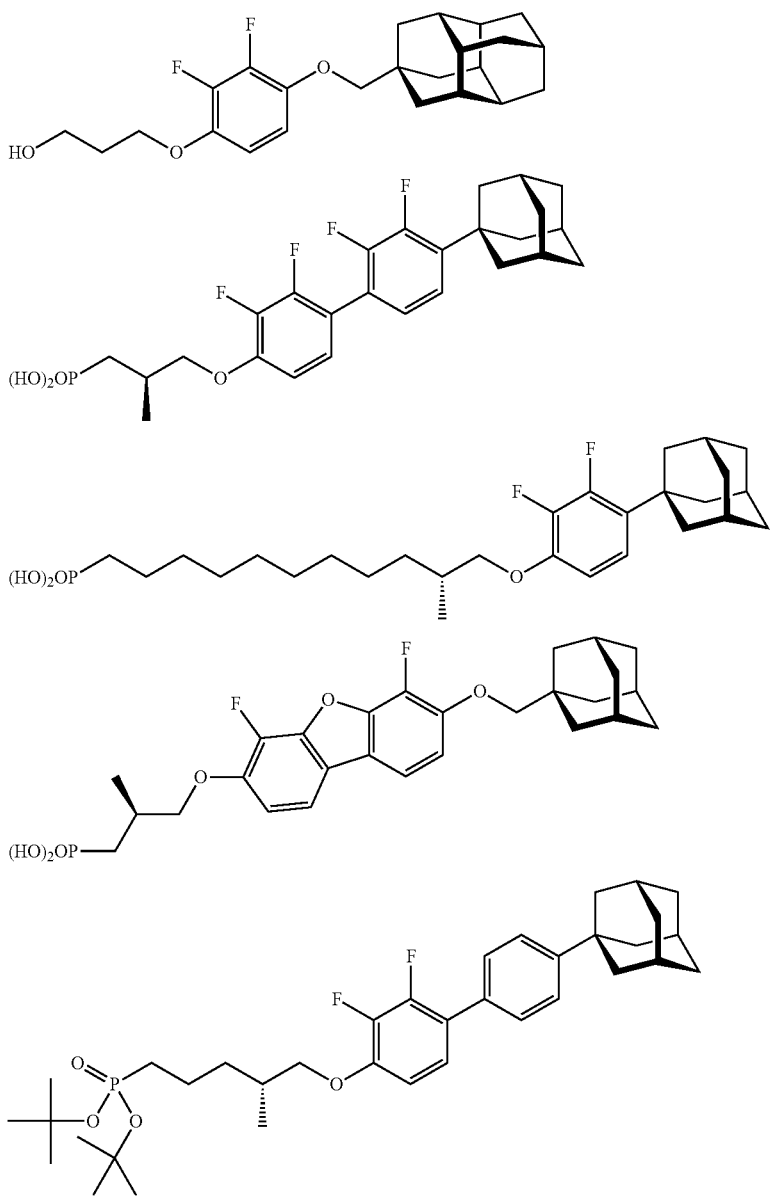

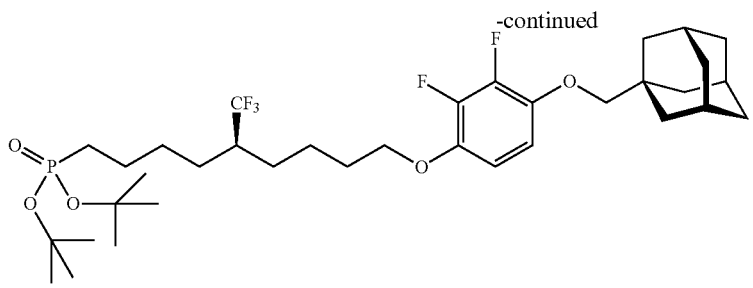

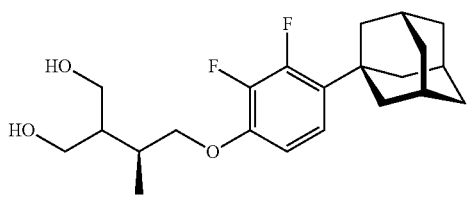

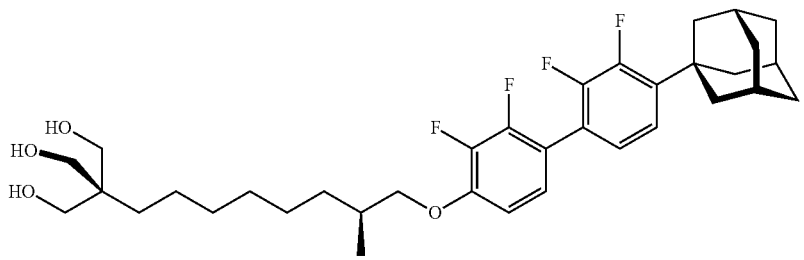

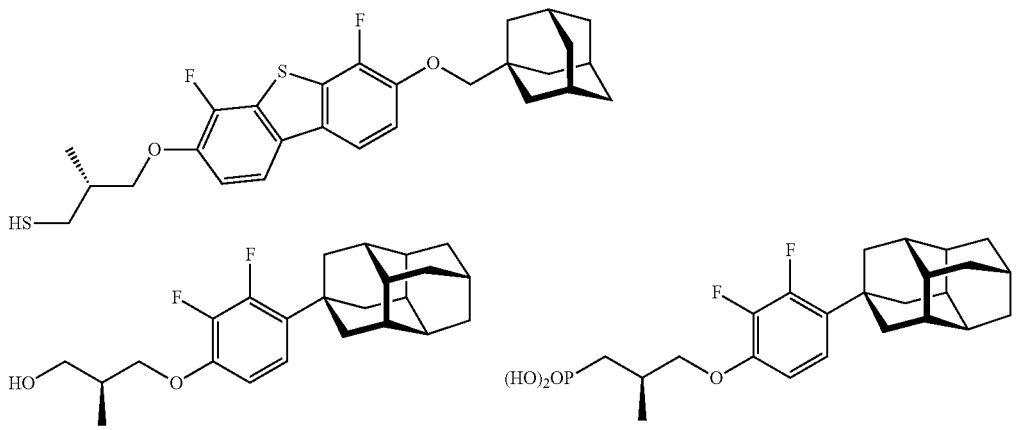

Use Examples

Contact Angle Measurement

The preparation of test chips is performed by the following steps:
1. Preparation of a solution of the compound to be investigated in THF (c=1 mmol/l)
2. $O_2$ plasma cleaning/oxidation of a 8×8 mm silicon chip with 30 nm Al (p<0.3 mbar $O_2$, t=1 min, 150 W (W=50%))
3. Immersion of chip into compound solution of step 1 for 72 h
4. Drying in a stream of $N_2$ gas
5. Bake (120° C.) in $N_2$ atmosphere for 1 h
6. Cleaning by short rinsing with THF
7. Drying in a stream of $N_2$ gas The following compounds are investigated:

| Compound | Contact Angle |
|---|---|
| 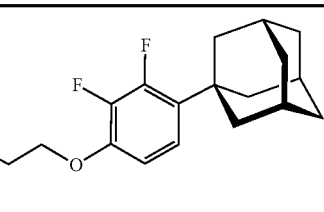 | 94.8° |
| 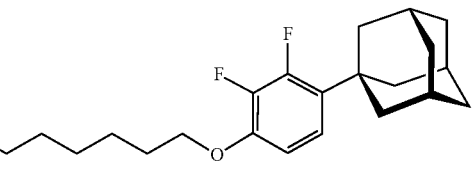 | 96.7° |
| 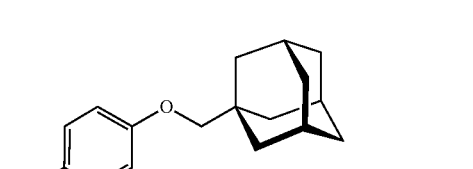 | 96.8° |
| 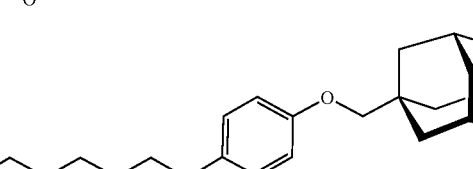 | 96.8° |

The contact angle of all adamantyl derivatives is significantly below 100°.

Comparative Examples

For comparison, the contact angle using the following compounds from the state of the art are measured and the contact angles given in the following table are obtained:

(HO)₂OP(CH₂)ₙO—[2,3-difluoro-4-(trans-4-pentylcyclohexyl)phenyl]

| n | contact angle |
|---|---|
| 2 | 101.0° |
| 3 | 104.1° |
| 4 | 105.3° |
| 5 | 106.4° |
| 6 | 105.4 |
| 8 | 106.7 |
| 10 | 107.6 |
| 11 | 105.6 |

It can be seen that the contact angle of the Comparative Examples is above 100°.

The contact angles of the adamantane derivatives according to the invention is almost the same for all of the examples, whereas the reference compounds tend to have lower contact angles for shorter linker lengths.

SAMs comprising one or more compounds according to the invention have better process stability because their surface energy is closer to the design range of most photoresist formulations. This ensures higher reproducibility of the wetting and film formation during a coating process.

Fabrication of Switching Devices

A molecular layer is prepared from Synthesis Example 2 (11-[4-(1-adamantyl)-2,3-difluoro-phenoxy]undecylphosphonic acid, PA-11O-Y-Ada) and another molecular layer is prepared for comparison from 11-[2,3-difluoro-4-(4-pentylcyclohexyl)phenoxy]undecylphosphonic acid (PA-11O-YC-5, Compound Example 19, page 63 of WO2018/007337 A2) as follows:

1) Preparation of the substrate: The starting material is a silicon-on-insulator wafer ("SOI wafer") with a diameter of 6 inches, having a silicon layer with a thickness of 110 nm with [100] orientation on a silicon oxide layer with a thickness of 200 nm on a slightly boron-doped silicon wafer with a thickness of 525 pm with [100] orientation and a resistivity of about 20 Ωcm.

The upper silicon layer is highly boron-doped by ion implantation (doping concentration $c\sim 5\times 10^{19}$ cm$^{-3}$, resistivity $\rho\sim 1.4$ m$\Omega$.cm). After doping, the wafer is divided into square parts ("chips") measuring 8 mm×8 mm. The chips are cleaned firstly in acetone and subsequently in isopropanol in an ultrasound bath for 10 min in each case.

2) Deposition of the phosphonic acid layer

The chips freshly produced as described above are cleaned again in acetone and isopropanol in an ultrasound bath for 5 min in each case and subsequently treated with piranha solution at 70° C. After rinsing with deionised water, the chips are treated with oxygen plasma (200 W, 7 min), producing a hydroxyl-populated silicon dioxide layer on the silicon conductor tracks, which hydrophilises the surface and makes it reactive to phosphonic acids.

For the deposition of the phosphonic acid layer the chips are dip-coated with a 250 µM solution of the corresponding phosphonic acid in tetrahydrofuran, then heated at 120° C. in an oven overnight and then washed with ethanol. This process essentially corresponds to the "TBAG" method known from the literature and gives a self-assembled monolayer.

The breakdown voltage of the molecular layers is determined using a mercury drop electrode according to the procedure described on pages 72 to 75 of WO2018/007337 A2. The following values are obtained:

PA-11O-Y-Ada: +5.38±0.68 V

PA-11O-YC-5: +3.90±0.32 V.

It can be seen that the adamantyl derivative according to the invention surprisingly gives devices with significantly higher brakdown voltage.

The electrical characterization of a switching device 100 (FIG. 1) comprising a molecular layer 140 obtained from the compound PA-11O-Y-Ada sandwiched between a TiN first electrode 130 (thickness 50 nm) on a silicon substrate 110 and a Ti second electrode 150 (10 nm) with gold contact 160 (80 nm) is done with a nanoprobe (Hitachi High Technologies Nano-Probe N-6000SS, probe size ca. 1 µm) and an Agilent B1500 device analyzer under SEM control. The device is fabricated starting from the same silicon substrate described above. The fabrication of the test devices follows industry-typical standard procedures. The titanium nitride first electrode 130 is deposited by reactive sputtering (Ti target, in N2 atmosphere).

A silicon wafer 110 with silicon oxide interlayer 120 coated with a 50 nm thick layer of TiN deposited by reactive sputtering is activated by ozone/UV treatment (110 W/300 s) and subsequently immersed into a 1 mM solution of the phosphonic acid PA-11O-Y-Ada (vide supra) in tetrahydrofuran (THF) for 24 h. The chip is removed from the immersion bath, blown dry with nitrogen and annealed under nitrogen at 120° C. for 60 min. Then, the chip is rinsed with THF on a spin-coater and subsequently annealed again under nitrogen at 120° C. for 5 min. The titanium top electrode 150 and the gold contact 160 are applied by sputtering using standard processes.

Figure 2:
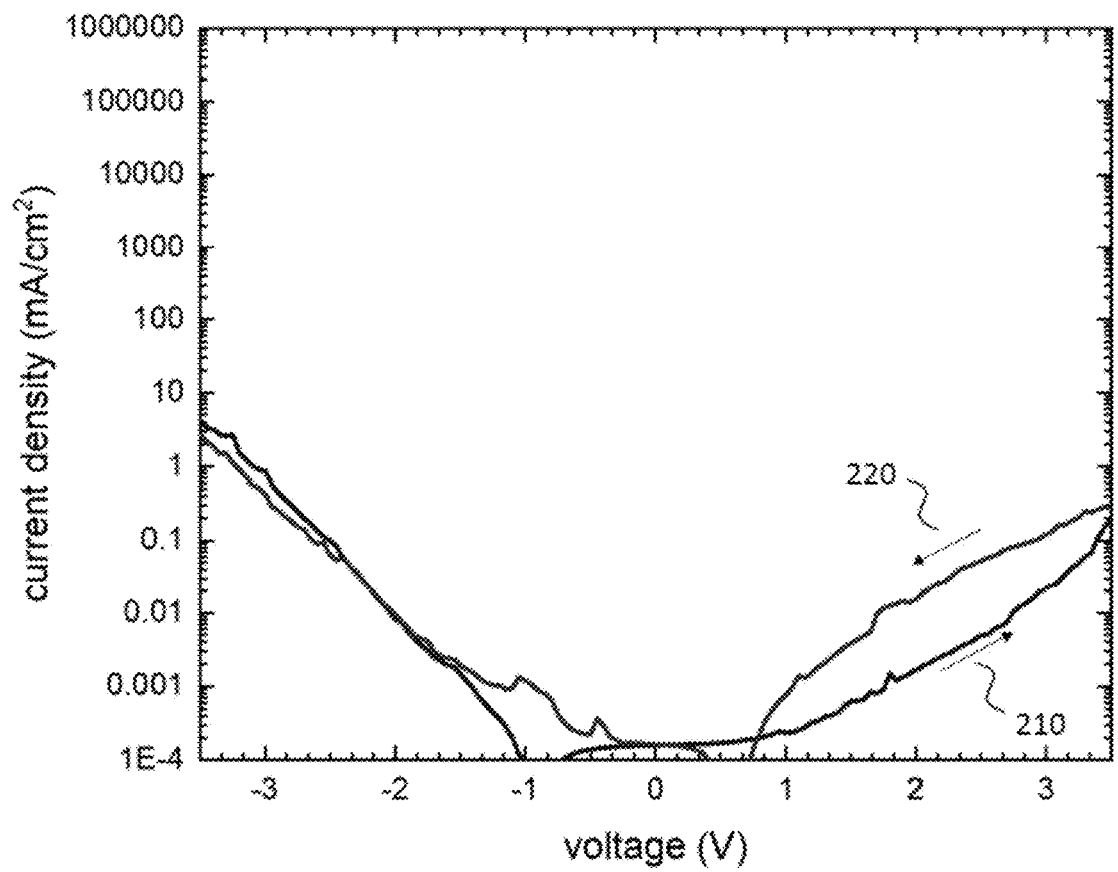

The result of the electrical characterisation of device 100 is shown in FIG. 2. A forward scan 210 starts at 0V and the voltage is increased to +3.5 V; a backward scan 220 then goes back to 0V, further up to −3.5 V and back to 0V. The scan speed is 300 mV/s. The resulting current is measured and the result is shown in FIG. 2. The device has an advantageously large memory window.

The invention claimed is:
1. A compound of formula I

$$D^1\text{-}Z^D\text{-}(A^1\text{-}Z^1)_r\text{-}B^1\text{-}(Z^2\text{-}A^2)_s\text{-}Sp\text{-}G \qquad (I)$$

in which
$D^1$ denotes a diamondoid radical,
$A^1$, $A^2$ on each occurrence, identically or differently, denote an aromatic, heteroaromatic, alicyclic or heteroaliphatic ring having 4 to 25 ring atoms, which optionally contains condensed rings and which may be mono-or polysubstituted by Y,
Y on each occurrence, identically or differently, denotes F, Cl, CN, SCN, SF$_5$ or a straight-chain, in each case, optionally fluorinated alkyl, alkoxy, alkylcarbonyl, alkoxycarbonyl, alkylcarbonyloxy or alkoxycarbonyloxy having 1 to 12 C atoms, or a branched, in each case, optionally fluorinated alkyl, alkoxy, alkylcarbonyl, alkoxycarbonyl. alkylcarbonyloxy or alkoxycarbonyloxy having 3 to 12 C atoms,
$B^1$ denotes

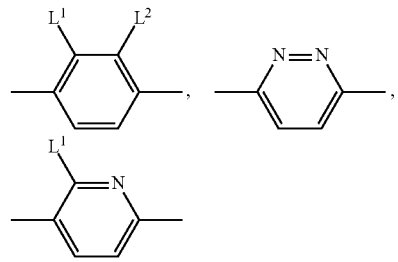

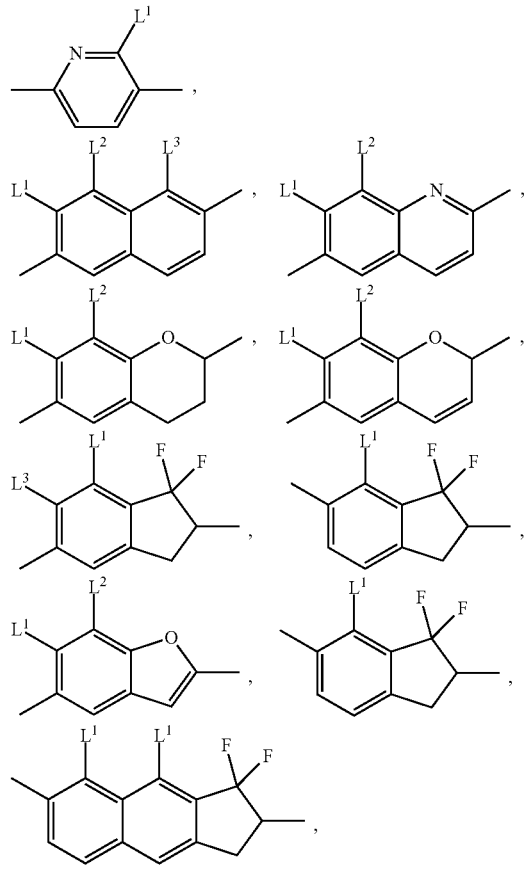

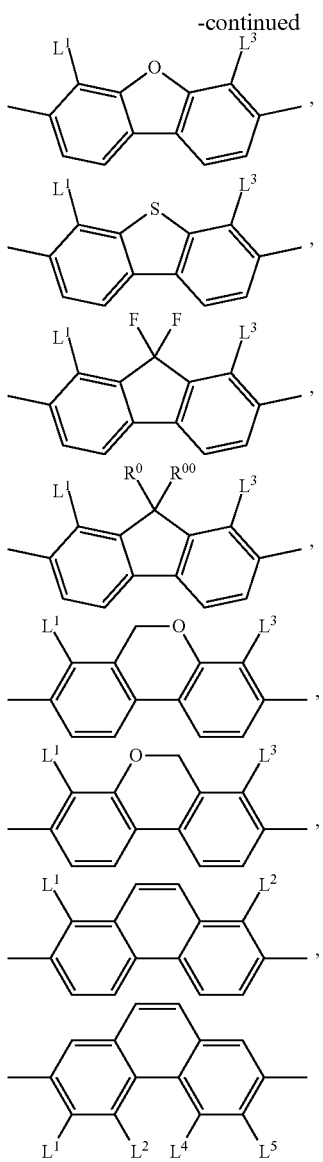

where the groups may be oriented in both directions,

L¹ to L⁵ independently of one another, denote F, Cl, Br, I, CN, SF₅, CF₃ or OCF₃, where L³ may alternatively also denote H, Z¹, Z² on each occurrence, identically or differently, denote a single bond, —CF₂O—, —OCF₂—, —CF₂S—, —SCF₂—, —CH₂O—, —OCH₂—, —C(O)O—, —OC(O)—, —C(O)S—, —SC(O)—, —(CH₂)$_{n1}$—, —(CF₂)$_{n2}$—, —CF₂—CH₂—, —CH₂—CF₂—, —CH=CH—, —CF=CF—, —CF=CH—, —CH=CF—, —(CH₂)$_{n3}$O—, —O(CH₂)$_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, Sp denotes Sp'-X', Sp' denotes a straight-chain alkylene having 1 to 20 C atoms or branched alkylene having 3 to 20 C atoms, which is optionally mono- or poly-substituted by F, Cl, Br, I or CN, and in which one or more non-adjacent CH₂ groups may each be replaced, independently of one another, by —O—, —S—, —NH—, —NR⁰—, —SiR⁰⁰R⁰⁰⁰—, —CO—, —COO—, —OCO—, —OCO—O—, —S—CO—, —CO—S—, —NR⁰—CO—O—, —O—CO—NR⁰—NR⁰—, —CO—NR⁰—, —CH=CH— or —C≡C— in such a way that O and/or S atoms are not linked directly to one another, X' denotes —O—, —S—, —CO—, —COO—, —OCO—, —O—COO—, —CO—NR⁰⁰—, —NR⁰⁰—CO—, —NR⁰⁰—CO—NR⁰⁰—, —OCH₂—, —CH₂O—, —SCH₂—CH₂S—, —CF₂O—, —OCF₂—, —CF₂S—, —SCF₂—, —CF₂CH₂—, —CH₂CF₂—, —CF₂CF₂—, —CH=n—, —N=CH—, —N=n—, —CH=CR⁰⁰—, —CY$^x$=CY$^x$—, C≡C—, —CH=CH—COO—, —OCO—CH=CH— or a single bond, R⁰, R⁰⁰ and R⁰⁰⁰ each, independently of one another, denote H or alkyl having 1 to 12 C atoms, Y$^x$ and Y$^{x''}$ each, independently of one another, denote H, F, Cl or CN, Z$^D$ has one of the meanings of Z¹ and Z² or of Sp, G denotes —CH=CH₂, —OH, —CH(CH₂OH)₂, —C(CH₂OH)₃, —SH, —SO₂OH, —OP(O)(OH)₂, —PO(OH)₂, —C(OH)(PO(OH)₂)₂, —COOH, —B(OH)₂, —Si(OR$^x$)₃ or —SiCl₃, —SO₂OR$^V$, —OP(O)(OR$^V$)₂, —PO(OR$^V$)₂, —C(OH)(PO(OR$^V$)₂)₂, —COOR$^V$, or —Si(OR$^V$)₃, R$^V$ denotes a straight-chain alkyl having 1 to 20 C atoms, or a branched alkyl having 3 to 20 C atoms R$^x$ denotes straight-chain alkyl having 1 to 6 C atoms, or branched alkyl having 3 to 6 C atoms, and r and s independently of one another, denote 0, 1, 2 or 3, where r+s≤4.

2. The compound according to claim 1, wherein D¹ is selected from the group consisting of adamantyl, diamantyl and triamantyl, in each of which one or more H atoms can be replaced by F or in each case optionally fluorinated alkyl, alkenyl or alkoxy having 1 to 12 C atoms.

3. The compound according to claim 1, wherein A¹ and A², on each occurrence, identically or differently are selected from the following groups:

a) 1,4-phenylene, in which one or two CH groups may be replaced by N and in which one or more H atoms may be replaced by Y, b) trans-1,4-cyclohexylene or 1,4-cyclohexenylene, in which one or more non-adjacent CH₂ groups may be replaced by —O— and/or —S— and in which; in addition; one or more H atoms may be replaced by Y, and c) 1,3-dioxolane-2,4-diyl, tetrahydrofuran-2,5-diyl, cyclobutane-1,3-diyl, 1,4-bicyclo[2.2.2]octanediyl, piperidine-1,5-diyl or thiophene-2,5-diyl, in which one or more H atoms may be replaced by Y, where Y on each occurrence, identically or differently, denotes F, Cl, CN, SCN, SF₅ or a straight-chain, in each case, optionally fluorinated alkyl, alkoxy, alkylcarbonyl, alkoxycarbonyl, alkylcarbonyloxy or alkoxycarbonyloxy having 1 to 12 C atoms, or a branched, in each case, optionally fluorinated alkyl, alkoxy, alkylcarbonyl, alkoxycarbonyl, alkylcarbonyloxy or alkoxycarbonyloxy having 3 to 12 C atoms.

4. The compound according to claim 1, wherein

Sp denotes a straight-chain alkylene having 1 to 12 C atoms or branched alkylene having 3 to 12 C atoms, which is optionally mono- or polysubstituted by F, Cl, Br, I or CN and in which one or more non-adjacent CH$_2$ groups may each be replaced, independently of one another, by —O—, —S—, —NH—, —NR$^0$—, —SiR$^{00}$R$^{000}$—, —CO—, —COO—, —OCO—, —OCO—O—, —S—CO—, —CO—S—, —NR$^0$—CO—, —O—CO—NR$^0$—, —NR$^0$—CO—O—, —CH=CH— or —C≡C— in such a way that O and/or S atoms are not linked directly to one another.

5. The compound according to claim 1, wherein B$^1$ denotes

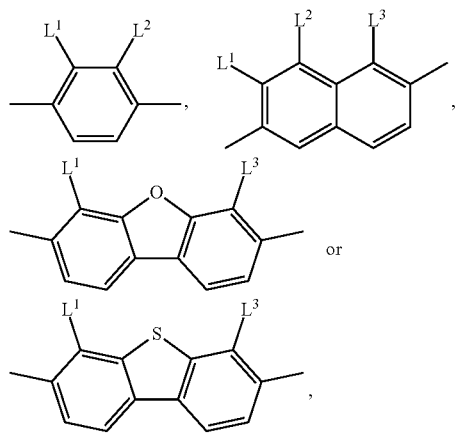

or

L$^1$ and L$^2$ independently of one another, denote Cl or F, where at least one of the radicals L$^1$ and L$^2$ denotes F, and L$^3$ denotes F.

6. The compound according to claim 1, wherein G denotes —P(O)(OH)$_2$, —OP(O)(OH)$_2$ or —C(OH)(PO(OH)$_2$)$_2$.

7. The compound according to claim 1, wherein ZD denotes a single bond, —C≡C—, —C(O)O—, —OC(O)—, —OCH$_2$—, —CH$_2$O—, —CH$_2$CH$_2$—, —CH$_2$CH$_2$CH$_2$—, or —CH$_2$CH$_2$CH$_2$CH$_2$—.

8. A Process for preparing a switching element, comprising at least the following steps:
 a) preparing a first electrode with a surface,
 b) depositing a molecular layer comprising one or more compounds of formula I according to claim 1 onto the surface of the first electrode, and
 c) applying a second electrode.

9. The process according to claim 8, wherein the first electrode comprises a material selected from the group consisting of Si, Ge, C, Sn, Se, GaAs, InAs, InP, GaSb, TaN, TiN, MON, WN, GaN, CdSe, ZnS, Au, Ag, Cu, Al, W, Ta, Ti, Co, Mo, Pt, Ru, Mg, ITO, IGO, IGZO, AZO and FTO.

10. A switching element comprising a molecular layer sandwiched between a first electrode and a second electrode, obtained by the process according to claim 8.

11. The switching element according to claim 10, wherein the molecular layer is a self-assembled monolayer.

12. A memristive device, comprising a switching element according to claim 10.

13. The compound according to claim 1, wherein L$^1$ to L$^5$ independently of one another, denote Cl or F, where L$^3$ may alternatively also denote H.

14. The compound according to claim 1, wherein B$^1$ denotes

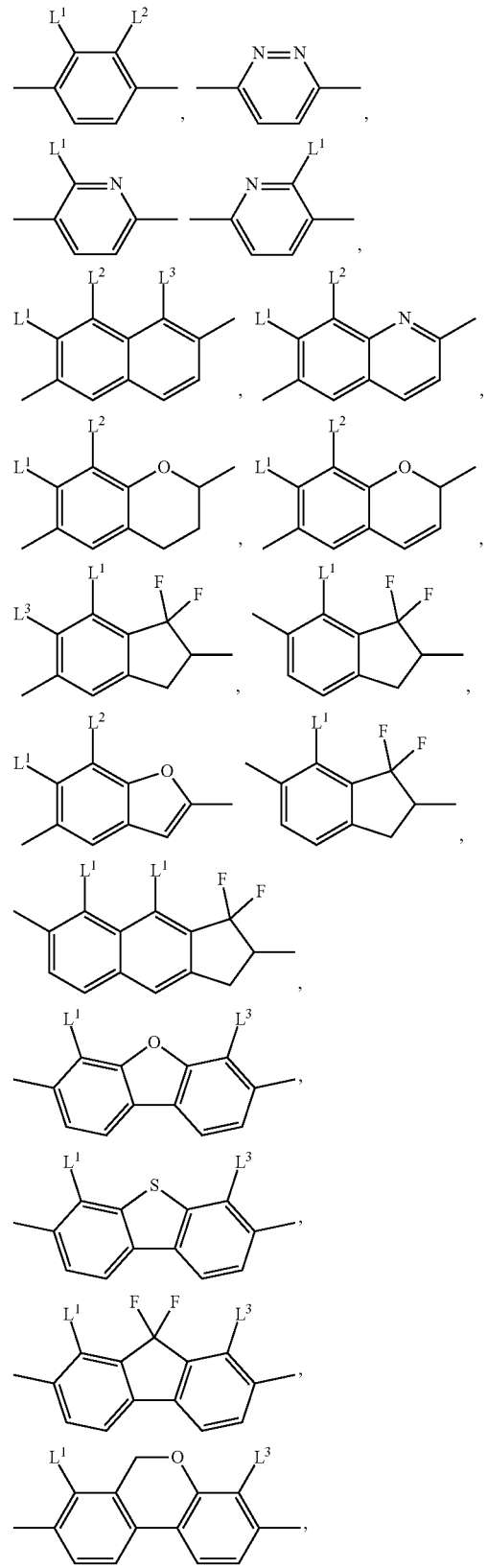

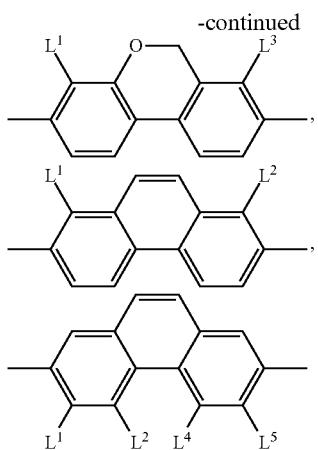

where the groups may be oriented in both directions.

15. The compound according to claim 3, wherein $D^1$ is selected from the group consisting of adamantyl, diamantyl and triamantyl, in each of which one or more H atoms can be replaced by F or in each case optionally fluorinated alkyl, alkenyl or alkoxy having 1 to 12 C atoms.

16. The compound according to claim 14, wherein $D^1$ is selected from the group consisting of adamantyl, diamantyl and triamantyl, in each of which one or more H atoms can be replaced by F or in each case optionally fluorinated alkyl, alkenyl or alkoxy having 1 to 12 C atoms.

17. The compound according to claim 14, wherein $A^1$ and $A^2$, on each occurrence, identically or differently are selected from the following groups:

a) 1,4-phenylene, in which one or two CH groups may be replaced by N and in which one or more H atoms may be replaced by Y,
b) trans-1,4-cyclohexylene or 1,4-cyclohexenylene, in which one or more non-adjacent $CH_2$ groups may be replaced by —O— and/or —S— and in which one or more H atoms may be replaced by Y, and
c) 1,3-dioxolane-2,4-diyl, tetrahydrofuran-2,5-diyl, cyclobutane-1,3-diyl, 1,4-bicyclo[2.2.2]octanediyl, piperidine-1,5-diyl or thiophene-2,5-diyl, in which one or more H atoms may be replaced by Y,
where
Y on each occurrence, identically or differently, denotes F, Cl, CN, SCN, $SF_5$ or a straight-chain, in each case, optionally fluorinated alkyl, alkoxy, alkylcarbonyl, alkoxycarbonyl, alkylcarbonyloxy or alkoxycarbonyloxy having 1 to 12 C atoms, or a branched, in each case, optionally fluorinated alkyl, alkoxy, alkylcarbonyl, alkoxycarbonyl, alkylcarbonyloxy or alkoxycarbonyloxy having 3 to 12 C atoms.

18. The compound according to claim 14, wherein G denotes —P(O)(OH)$_2$, —OP(O)(OH)$_2$ or —C(OH)(PO(OH)$_2$)$_2$.

19. The compound according to claim 14, wherein $Z^D$ denotes a single bond, —C≡C—, —C(O)O—, —OC(O)—, —OCH$_2$—, —CH$_2$O—, —CH$_2$CH$_2$—, —CH$_2$CH$_2$CH$_2$—, or —CH$_2$CH$_2$CH$_2$CH$_2$—.

20. The compound according to claim 17, wherein $D^1$ is selected from the group consisting of adamantyl, diamantyl and triamantyl, in each of which one or more H atoms can be replaced by F or in each case optionally fluorinated alkyl, alkenyl or alkoxy having 1 to 12 C atoms.

* * * * *